United States Patent
Yu et al.

(10) Patent No.: US 11,967,286 B2
(45) Date of Patent: Apr. 23, 2024

(54) DISPLAY SUBSTRATE AND MANUFACTURING METHOD THEREOF, DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Pengfei Yu, Beijing (CN); Qiang Zhang, Beijing (CN); Tinghua Shang, Beijing (CN); Lu Bai, Beijing (CN); Jie Dai, Beijing (CN); Chenxing Wan, Beijing (CN); Haigang Qing, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 78 days.

(21) Appl. No.: 17/434,857

(22) PCT Filed: Sep. 30, 2020

(86) PCT No.: PCT/CN2020/119277
§ 371 (c)(1),
(2) Date: Aug. 30, 2021

(87) PCT Pub. No.: WO2022/067634
PCT Pub. Date: Apr. 7, 2022

(65) Prior Publication Data
US 2022/0319434 A1    Oct. 6, 2022

(51) Int. Cl.
*G11C 19/28* (2006.01)
*G09G 3/3266* (2016.01)
(Continued)

(52) U.S. Cl.
CPC .......... *G09G 3/3266* (2013.01); *G11C 19/28* (2013.01); *G09G 2230/00* (2013.01);
(Continued)

(58) Field of Classification Search
CPC ............. G09G 3/3266; G09G 2230/00; G09G 2300/0408; G09G 2300/0426;
(Continued)

(56) References Cited

U.S. PATENT DOCUMENTS

2015/0279480 A1   10/2015   Murakami et al.
2019/0304374 A1*  10/2019   Wang ................... G09G 3/3266
(Continued)

FOREIGN PATENT DOCUMENTS

CN        110095889 A        8/2019
CN        110767665 A        2/2020
(Continued)

OTHER PUBLICATIONS

Extended European Search Report issued in European Application No. 20955659.6 dated May 2, 2023.

*Primary Examiner* — Adam J Snyder
(74) *Attorney, Agent, or Firm* — Dilworth & Barrese, LLP.; Michael J. Musella, Esq.

(57) ABSTRACT

A display substrate and a manufacturing method thereof, and a display device are provided. The display substrate includes a base substrate, and includes a shift register unit, a first clock signal line, and a second clock signal line in a peripheral region; a first portion and a second portion of a first connection wire of the display substrate are connected to a first gate electrode of a first control transistor of the shift register unit; an orthographic projection of the first portion on the base substrate is on a side of an orthographic projection of an active layer of the first control transistor on the base substrate away from a display region; and an
(Continued)

orthographic projection of the second portion on the base substrate is on a side of the orthographic projection of the active layer of the first control transistor on the base substrate close to the display region.

19 Claims, 7 Drawing Sheets

(51) Int. Cl.
*H01L 21/77* (2017.01)
*H01L 27/12* (2006.01)

(52) U.S. Cl.
CPC ............... *G09G 2300/0408* (2013.01); *G09G 2300/0426* (2013.01); *G09G 2310/0286* (2013.01); *G09G 2310/061* (2013.01); *H01L 21/77* (2013.01); *H01L 27/12* (2013.01)

(58) Field of Classification Search
CPC ...... G09G 2310/0286; G09G 2310/061; H01L 21/77; H01L 27/12; G11C 19/28
See application file for complete search history.

(56) References Cited

U.S. PATENT DOCUMENTS

| | | | | |
|---|---|---|---|---|
| 2019/0318693 | A1* | 10/2019 | Jung | ............... G09G 3/3266 |
| 2020/0302870 | A1* | 9/2020 | Jang | ............... G09G 3/3266 |
| 2022/0310184 | A1* | 9/2022 | Zhang | ............... G11C 19/28 |

FOREIGN PATENT DOCUMENTS

| | | | | | |
|---|---|---|---|---|---|
| CN | 111210776 | A | | 5/2020 | |
| CN | 111243650 | A | | 6/2020 | |
| CN | 111540313 | A | * | 8/2020 | ........... G09G 3/3225 |
| CN | 111540313 | A | | 8/2020 | |

\* cited by examiner

DISPLAY SUBSTRATE AND MANUFACTURING METHOD THEREOF, DISPLAY DEVICE

TECHNICAL FIELD

Embodiments of the present disclosure relate to a display substrate and a manufacturing method thereof, and a display device.

BACKGROUND

In the field of display technology, a pixel array of such as a liquid crystal display panel or an organic light-emitting diode (OLED) display panel usually includes gate lines in a plurality of rows and data lines in a plurality of columns, and the data lines are intersected with the gate lines. The gate lines can be driven by an integrated driving circuit bonded to the display panel. In recent years, with continuous improvement in the manufacturing process of amorphous silicon thin film transistors or oxide thin film transistors, a gate driving circuit can also be directly integrated on a thin film transistor array substrate to form a gate driver on array (GOA) for driving the gate lines. For example, the GOA including a plurality of shift register units which are cascaded may be adopted to provide voltage signals (scanning signals) of turn-on and turn-off states to the gate lines in the plurality of rows of the pixel array, so as to control the gate lines in the plurality of rows to be turned on in sequence. Meanwhile, data signals are provided to pixel units in the corresponding row(s) of the pixel array through the data lines, so as to form gray scale voltages required by gray scales of a display image in respective pixel units, thereby displaying a frame of image.

SUMMARY

At least one embodiment of the present disclosure provides a display substrate, and the display substrate includes: a base substrate, including a display region and a peripheral region on at least one side of the display region; and a shift register unit, a first clock signal line, and a second clock signal line, which are in the peripheral region of the base substrate; the first clock signal line and the second clock signal line extend along a first direction on the base substrate, and are configured to provide a first clock signal or a second clock signal to the shift register unit, respectively; the shift register unit includes an input circuit, a first node control circuit, a second node control circuit, a third node control circuit, a fourth node control circuit, and an output circuit; the input circuit is configured to input an input signal to a first node in response to the first clock signal; the second node control circuit is configured to input a first voltage or the first clock signal to a second node under control of the first clock signal and a level of the first node, so as to control a level of the second node; the first node control circuit is configured to input a second voltage to the first node under control of the second clock signal and the level of the second node, so as to perform noise reduction on the first node; the third node control circuit is configured to control a level of a third node in response to the level of the second node; the fourth node control circuit is configured to input the level of the third node to a fourth node under control of the second clock signal; the output circuit is configured to output the second voltage to an output terminal under control of a level of the fourth node; the second node control circuit includes a first control transistor, and the first control transistor includes a first gate electrode; the display substrate further includes a first connection wire, and the first connection wire includes a first portion and a second portion; the first portion of the first connection wire is connected to and integrally formed with the first gate electrode of the first control transistor, the first portion of the first connection wire extends along the first direction, and an orthographic projection of the first portion of the first connection wire on the base substrate is on a side of an orthographic projection of an active layer of the first control transistor on the base substrate away from the display region; and the second portion of the first connection wire is connected to and integrally formed with the first gate electrode of the first control transistor, the second portion of the first connection wire extends along a direction, opposite to an extending direction of the first portion of the first connection wire, in the first direction, and an orthographic projection of the second portion of the first connection wire on the base substrate is on a side of the orthographic projection of the active layer of the first control transistor on the base substrate close to the display region.

For example, in the display substrate provided by at least one embodiment of the present disclosure, the first control transistor further includes a second gate electrode, the first gate electrode and the second gate electrode of the first control transistor are in parallel in the first direction, and the second gate electrode of the first control transistor is connected to and integrally formed with the first portion of the first connection wire.

For example, the display substrate provided by at least one embodiment of the present disclosure further includes an output reset circuit; the output reset circuit is configured to reset the output terminal under control of the level of the first node; the output reset circuit includes a first capacitor and an output reset transistor; a first electrode of the first capacitor is connected to and integrally formed with the first portion of the first connection wire, and an orthographic projection of the first electrode of the first capacitor on the base substrate is on an imaginary line, in the first direction, of the orthographic projection of the active layer of the first control transistor on the base substrate; and an orthographic projection of an active layer of the output reset transistor on the base substrate is on a side of an orthographic projection of the first capacitor on the base substrate close to the display region.

For example, in the display substrate provided by at least one embodiment of the present disclosure, the first connection wire further includes a third portion, the third portion of the first connection wire is connected to and integrally formed with the first electrode of the first capacitor and a gate electrode of the output reset transistor, and the gate electrode of the output reset transistor includes a plurality of sub-gate electrodes arranged in parallel in the first direction.

For example, in the display substrate provided by at least one embodiment of the present disclosure, the input circuit includes an input transistor, an active layer of the input transistor extends along the first direction, the active layer of the first control transistor extends along the first direction, and an orthographic projection of the active layer of the input transistor on the base substrate is on a side of the orthographic projection of the active layer of the first control transistor on the base substrate away from the orthographic projection of the first capacitor on the base substrate and close to the display region.

For example, the display substrate provided by at least one embodiment of the present disclosure further includes a first transfer-connection electrode, a first terminal of the first transfer-connection electrode is connected to the second portion of the first connection wire through a via hole penetrating through an insulating layer, and a second terminal of the first transfer-connection electrode is connected to a first electrode of the input transistor.

For example, in the display substrate provided by at least one embodiment of the present disclosure, the second node control circuit further includes a second control transistor; an active layer of the second control transistor includes a first portion and a second portion which are integrally formed, the first portion of the active layer of the second control transistor extends along a direction different from the first direction, and the second portion of the active layer of the second control transistor extends along the first direction; and an orthographic projection of the active layer of the second control transistor on the base substrate is between the orthographic projection of the active layer of the input transistor on the base substrate and the orthographic projection of the active layer of the first control transistor on the base substrate.

For example, the display substrate provided by at least one embodiment of the present disclosure further includes a second connection wire in a substantially "Y" shape, the second connection wire is connected to and integrally formed with a gate electrode of the input transistor and a gate electrode of the second control transistor, a first terminal of the second connection wire is connected to the gate electrode of the input transistor, a second terminal of the second connection wire is connected to the gate electrode of the second control transistor, and a third terminal of the second connection wire is connected to the first clock signal line or the second clock signal line through a via hole penetrating through an insulating layer to receive the first clock signal.

For example, the display substrate provided by at least one embodiment of the present disclosure further includes a second transfer-connection electrode, a first terminal of the second transfer-connection electrode is connected to a second electrode of the first control transistor, and a gate electrode of the second control transistor is connected to a second terminal of the second transfer-connection electrode through a via hole penetrating through an insulating layer.

For example, the display substrate provided by at least one embodiment of the present disclosure further includes a first power line for providing the first voltage, the first power line is connected to a second electrode of the second control transistor, and an orthographic projection of the first power line on the base substrate is on a side of an orthographic projection of a gate electrode of the second control transistor on the base substrate away from the display region.

For example, in the display substrate provided by at least one embodiment of the present disclosure, the third node control circuit includes a third control transistor and a second capacitor; an orthographic projection of an active layer of the third control transistor on the base substrate and an orthographic projection of the second capacitor on the base substrate are on a side of the orthographic projection of the active layer of the first control transistor on the base substrate close to the display region, and the orthographic projection of the second capacitor on the base substrate is on a side of the orthographic projection of the active layer of the third control transistor on the base substrate away from the orthographic projection of the first capacitor on the base substrate; and a gate electrode of the third control transistor extends along a second direction different from the first direction, and the active layer of the third control transistor extends along the first direction.

For example, the display substrate provided by at least one embodiment of the present disclosure further includes a third connection wire, the third connection wire is connected to and integrally formed with a first electrode of the second capacitor and the gate electrode of the third control transistor, and a first terminal of the third connection wire is connected to the first electrode of the second capacitor.

For example, the display substrate provided by at least one embodiment of the present disclosure further includes a third transfer-connection electrode; the third transfer-connection electrode includes a first portion extending along the first direction and a second portion extending along the second direction, and the first portion and the second portion of the third transfer-connection electrode are integrally formed; the first portion of the third transfer-connection electrode is connected to a first electrode of the second control transistor; the second portion of the third transfer-connection electrode is connected to a first electrode of the first control transistor; and a second terminal of the third connection wire is connected to the third transfer-connection electrode through a via hole penetrating through an insulating layer, so as to allow the gate electrode of the third control transistor to be connected to the first electrode of the first control transistor and the first electrode of the second control transistor which are in a layer different from the gate electrode of the third control transistor.

For example, the display substrate provided by at least one embodiment of the present disclosure further includes a fourth node noise reduction circuit, the fourth node noise reduction circuit is configured to perform noise reduction on the fourth node under control of the level of the first node, the fourth node noise reduction circuit includes a first noise reduction transistor, and an orthographic projection of an active layer of the first noise reduction transistor on the base substrate is on a side of the orthographic projection of the first capacitor on the base substrate close to the display region, and on a side of the orthographic projection of the active layer of the third control transistor away from the orthographic projection of the second capacitor on the base substrate.

For example, in the display substrate provided by at least one embodiment of the present disclosure, an orthographic projection of the first electrode of the first capacitor on the base substrate has a stepped shape in the first direction, and has a protrusion protruding along the second direction as a gate electrode of the first noise reduction transistor.

For example, in the display substrate provided by at least one embodiment of the present disclosure, the fourth node control circuit includes a fourth control transistor, and an orthographic projection of an active layer of the fourth control transistor on the base substrate is between the orthographic projection of the active layer of the third control transistor on the base substrate and the orthographic projection of the active layer of the first noise reduction transistor on the base substrate.

For example, in the display substrate provided by at least one embodiment of the present disclosure, the active layer of the third control transistor, the active layer of the fourth control transistor, and the active layer of the first noise reduction transistor are in a continuous first semiconductor layer, the active layer of the fourth control transistor and the active layer of the first noise reduction transistor extend along the first direction, and a gate electrode of the fourth control transistor and a gate electrode of the first noise reduction transistor extend along the second direction and are arranged in parallel in the first direction.

For example, the display substrate provided by at least one embodiment of the present disclosure further includes a fourth transfer-connection electrode and a first connection electrode; the fourth transfer-connection electrode is connected to a first electrode of the third control transistor, a gate electrode of the fourth control transistor is connected to the fourth transfer-connection electrode through a via hole penetrating through an insulating layer, and a second electrode of the first capacitor is connected to the fourth transfer-connection electrode through a via hole penetrating through an insulating layer; and the first connection electrode and the second electrode of the first capacitor are in an identical layer, a first terminal of the first connection electrode is connected to the first clock signal line or the second clock signal line through a via hole penetrating through an insulating layer to receive the second clock signal, and a second terminal of the first connection electrode is connected to the fourth transfer-connection electrode through a via hole penetrating through an insulating layer.

For example, the display substrate provided by at least one embodiment of the present disclosure further includes a fifth transfer-connection electrode, the fifth transfer-connection electrode is connected to a second electrode of the third control transistor and a first electrode of the fourth control transistor, and a second electrode of the second capacitor is connected to the fifth transfer-connection electrode through a via hole penetrating through an insulating layer.

For example, in the display substrate provided by at least one embodiment of the present disclosure, the output circuit includes a third capacitor and an output transistor; an orthographic projection of the third capacitor on the base substrate and the orthographic projection of the second capacitor on the base substrate are arranged in parallel in the first direction, and the orthographic projection of the third capacitor on the base substrate and the orthographic projection of the first capacitor on the base substrate are arranged in parallel in the second direction; and an orthographic projection of an active layer of the output transistor on the base substrate is on a side of the orthographic projection of the second capacitor on the base substrate close to the display region, and the orthographic projection of the active layer of the output reset transistor on the base substrate is on a side of the orthographic projection of the third capacitor on the base substrate close to the display region.

For example, in the display substrate provided by at least one embodiment of the present disclosure, a contour of a side of an orthographic projection of a first electrode of the third capacitor on the base substrate towards the orthographic projection of the second capacitor on the base substrate is stepped.

For example, in the display substrate provided by at least one embodiment of the present disclosure, the active layer of the output transistor and the active layer of the output reset transistor are in a continuous second semiconductor layer, and the second semiconductor layer extends along the first direction; the orthographic projection of the active layer of the output transistor on the base substrate and the orthographic projection of the second capacitor on the base substrate are arranged in parallel in the second direction, and the orthographic projection of the active layer of the output reset transistor on the base substrate and the orthographic projection of the third capacitor on the base substrate are arranged in parallel in the second direction; a gate electrode of the output transistor and a gate electrode of the output reset transistor extend along the first direction; and the gate electrode of the output transistor includes a plurality of sub-gate electrodes arranged in parallel in the first direction.

For example, in the display substrate provided by at least one embodiment of the present disclosure, an orthographic projection of a gate electrode of the output reset transistor on the base substrate is closer to the display region than an orthographic projection of a gate electrode of the output transistor on the base substrate; and a size of the orthographic projection of the active layer of the output reset transistor on the base substrate in the second direction is smaller than a size of the orthographic projection of the active layer of the output transistor on the base substrate in the second direction.

For example, the display substrate provided by at least one embodiment of the present disclosure further includes a fourth connection wire, a sixth transfer-connection electrode, and a second power line for providing the second voltage; an orthographic projection of the second power line on the base substrate is on a side of the orthographic projection of the second capacitor on the base substrate close to the display region, the orthographic projection of the third capacitor on the base substrate partially overlaps with the orthographic projection of the second power line on the base substrate, and a second electrode of the third capacitor is connected to the second power line through a via hole penetrating through an insulating layer; the fourth connection wire is connected to and integrally formed with a first electrode of the third capacitor and a gate electrode of the output transistor; the sixth transfer-connection electrode includes a first portion extending along the first direction and a second portion extending along the second direction, and the first portion and the second portion of the sixth transfer-connection electrode are integrally formed; and the second portion of the sixth transfer-connection electrode is connected to a second electrode of the fourth control transistor and a first electrode of the first noise reduction transistor, and the first electrode of the third capacitor is connected to the first portion of the sixth transfer-connection electrode through a via hole penetrating through an insulating layer.

For example, in the display substrate provided by at least one embodiment of the present disclosure, the second power line includes a protrusion protruding away from the display region in the second direction, and a second electrode of the first noise reduction transistor is connected to the protrusion of the second power line.

For example, the display substrate provided by at least one embodiment of the present disclosure further includes a seventh transfer-connection electrode, an eighth transfer-connection electrode, and a second connection electrode; the seventh transfer-connection electrode is connected to a second electrode of the output transistor, and the eighth transfer-connection electrode is connected to a second electrode of the output reset transistor; the second connection electrode and a second electrode of the first capacitor are in an identical layer, and the seventh transfer-connection electrode and the eighth transfer-connection electrode are connected to the second connection electrode through via holes penetrating through an insulating layer, respectively; and the second connection electrode serves as the output terminal and is connected to a gate line, so as to output an output signal of the output terminal to a pixel unit of the display region.

For example, the display substrate provided by at least one embodiment of the present disclosure further includes a ninth transfer-connection electrode, a first terminal of the ninth transfer-connection electrode is connected to a second electrode of the input transistor, and a second terminal of the ninth transfer-connection electrode is connected to a second connection electrode of a previous shift register unit through a via hole.

For example, in the display substrate provided by at least one embodiment of the present disclosure, the first node control circuit includes a second noise reduction transistor and a third noise reduction transistor; the active layer of the input transistor, an active layer of the second noise reduction transistor, and an active layer of the third noise reduction transistor are in a continuous third semiconductor layer, so as to allow a first electrode of the input transistor to be connected to a first electrode of the second noise reduction transistor and allow a second electrode of the second noise reduction transistor to be connected to a second electrode of the third noise reduction transistor; an orthographic projection of the active layer of the second noise reduction transistor on the base substrate and an orthographic projection of the active layer of the third noise reduction transistor on the base substrate are on a side of the orthographic projection of the active layer of the first control transistor on the base substrate away from the orthographic projection of the first capacitor on the base substrate, and on a side of the orthographic projection of the active layer of the input transistor on the base substrate close to the display region; and the orthographic projection of the active layer of the third noise reduction transistor on the base substrate is on a side of the orthographic projection of the active layer of the second noise reduction transistor on the base substrate away from the orthographic projection of the active layer of the input transistor on the base substrate.

For example, in the display substrate provided by at least one embodiment of the present disclosure, an orthographic projection of a second power line for providing the second voltage on the base substrate partially overlaps with the orthographic projection of the active layer of the third noise reduction transistor on the base substrate, a gate electrode of the third noise reduction transistor is connected to and integrally formed with a first electrode of the second capacitor, and a gate electrode of the second noise reduction transistor is connected to the fourth transfer-connection electrode through a via hole penetrating through an insulating layer.

For example, in the display substrate provided by at least one embodiment of the present disclosure, an orthographic projection of the first clock signal line on the base substrate and an orthographic projection of the second clock signal line on the base substrate are on a side of the orthographic projection of the first power line on the base substrate away from the display region.

For example, the display substrate provided by at least one embodiment of the present disclosure further includes a third power line for providing the first voltage, an orthographic projection of the third power line on the base substrate is between an orthographic projection of the shift register unit on the base substrate and the display region, the third power line includes a protrusion protruding away from the display region in a second direction different from the first direction, and a first electrode of the output reset transistor is connected to the protrusion of the third power line.

For example, the display substrate provided by at least one embodiment of the present disclosure further includes a trigger signal line, a plurality of shift register units, which are cascaded, form a gate driving circuit, the trigger signal line is configured to provide a trigger signal to the gate driving circuit, an orthographic projection of the trigger signal line on the base substrate is on a side of an orthographic projection of the first clock signal line and the second clock signal line on the base substrate away from the display region, and the trigger signal line is connected to a second electrode of an input transistor of a first shift register unit in the gate driving circuit to provide the trigger signal.

At least one embodiment of the present disclosure further provides a display device, and the display device includes the display substrate provided by any one of the embodiments of the present disclosure.

For example, in the display device provided by at least one embodiment of the present disclosure, the display device is an organic light-emitting diode display device.

For example, the display device provided by at least one embodiment of the present disclosure further includes pixel units arranged in an array, and an output signal, output by the output circuit of the shift register unit, is output to the pixel units as a light-emitting control signal to drive the pixel units to emit light.

For example, in the display device provided by at least one embodiment of the present disclosure, an output signal output by an output circuit of one shift register unit is correspondingly output to two rows of pixel units.

At least one embodiment of the present disclosure further provides a manufacturing method of the display substrate provided by any one of the embodiments of the present disclosure, and the manufacturing method includes: providing the base substrate, and forming the shift register unit, a first power line for providing the first voltage, a third power line for providing the first voltage, a second power line for providing the second voltage, the first clock signal line, and the second clock signal line on the base substrate; forming the shift register unit, includes: forming a semiconductor layer, a first insulating layer, a first conductive layer, a second insulating layer, a second conductive layer, a third insulating layer, and a third conductive layer in sequence in a direction perpendicular to the base substrate; active layers of respective transistors are in the semiconductor layer, gate electrodes of the respective transistors and first electrodes of respective capacitors are in the first conductive layer, second electrodes of the respective capacitors are in the second conductive layer, and the first power line, the second power line, the third power line, the first clock signal line, the second clock signal line, and first electrodes and second electrodes of the respective transistors are in the third conductive layer; and the transistors and the capacitors are correspondingly connected to each other through via holes penetrating through the first insulating layer, the second insulating layer, or the third insulating layer, and the transistors and the capacitors are correspondingly connected to the first power line, the second power line, the third power line, the first clock signal line, and the second clock signal line through via holes penetrating through the first insulating layer, the second insulating layer, or the third insulating layer.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

Figure 1A:
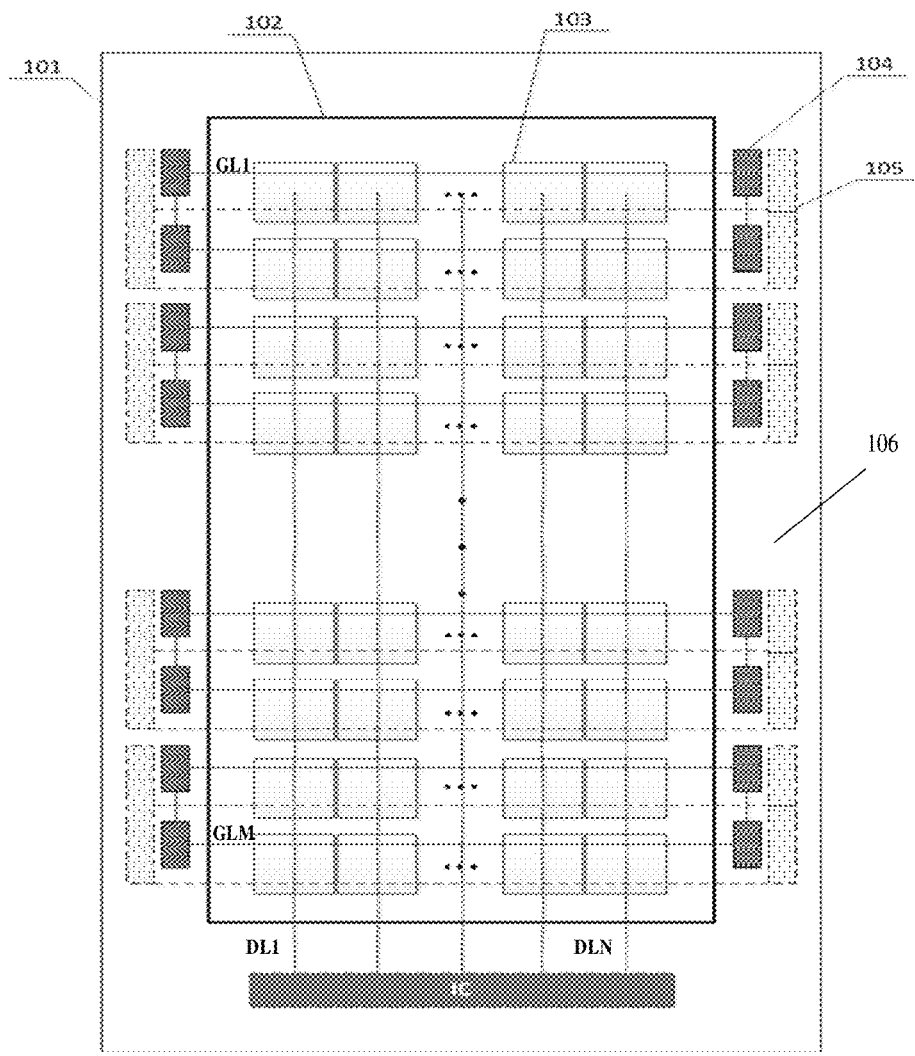
FIG. 1A is a schematic diagram of an overall circuit architecture of a display panel.

In order to make objects, technical details and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

Hereinafter, the present disclosure will be described by several specific embodiments. In order to keep the following description of the embodiments of the present disclosure clear and concise, detailed descriptions of known functions and known components may be omitted. In the case where any component of the embodiments of the present disclosure appears in more than one drawing, the component is represented by the same reference numeral in each of different drawings.

FIG. 1A is a schematic diagram of an overall circuit architecture of a display panel. For example, as illustrated in FIG. 1A, 101 represents an overall outer frame line of a display panel. The display panel includes a display region (i.e., a pixel array region) 102 and a peripheral region 106 located around the display region 102. The display region 102 includes pixel units 103 which are arranged in an array. The peripheral region 106 includes a scan driving shift register unit 104, a plurality of scan driving shift register units 104 which are cascaded form a gate driving circuit (a gate GOA), and the gate driving circuit is configured to provide such as gate scanning signals which are shifted row by row to the pixel units 103 arranged in an array in the display region 102 of the display panel 101. The peripheral region 106 further includes a light-emitting control shift register unit 105, a plurality of light-emitting control shift register units 105 which are cascaded form a light-emitting control driving circuit array (an EM GOA), and the light-emitting control driving circuit array is configured to provide such as light-emitting control signals which are shifted row by row to the pixel units 103 arranged in an array in the display region 102 of the display panel 101, that is, the light-emitting control driving circuit array is a gate driving circuit for outputting light-emitting control signals.

In some embodiments, the output signal output by the output circuit of one shift register unit 104 is correspondingly output to two rows of pixel units 103.

As illustrated in FIG. 1A, data lines DL1-DLN (N is an integer greater than 1), connected to a data driver chip IC, longitudinally cross the display region 102 to provide data signals to the pixel units 103 arranged in an array, and gate lines GL1-GLM (M is an integer greater than 1), connected to the scan driving shift register units 104 and the light-emitting control shift register units 105, horizontally cross the display region 102 to provide gate scanning signals and light-emitting control signals to the pixel units 103 arranged in an array. For example, each of the pixel units 103 may include a pixel circuit adopting a circuit structure, such as 7T1C (seven transistors and one capacitor), 8T2C (eight transistors and two capacitors), 4T1C (four transistors and one capacitor), or the like in the art, and a light-emitting element, and the pixel circuit works under control of the data signal transmitted through the data line, and the gate scanning signal and the light-emitting control signal which are transmitted through the gate line, so as to drive the light-emitting element to emit light and achieve operations such as display. For example, the light-emitting element may be an organic light-emitting diode (OLED) or a quantum dot light-emitting diode (QLED).

Figure 1B:
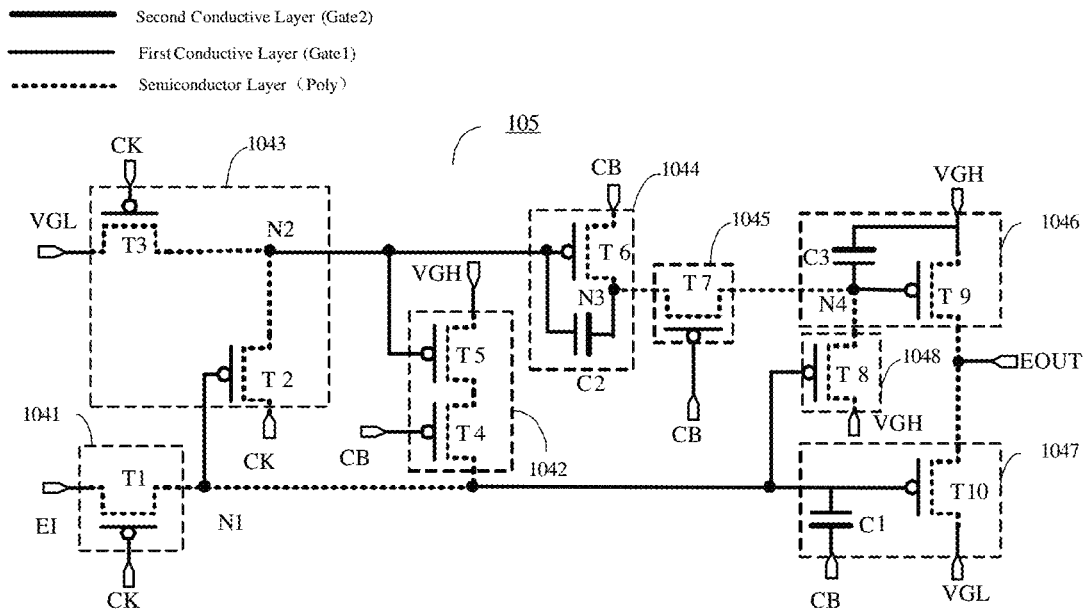
FIG. 1B is a circuit diagram of a light-emitting control shift register unit.
Figure 1C:
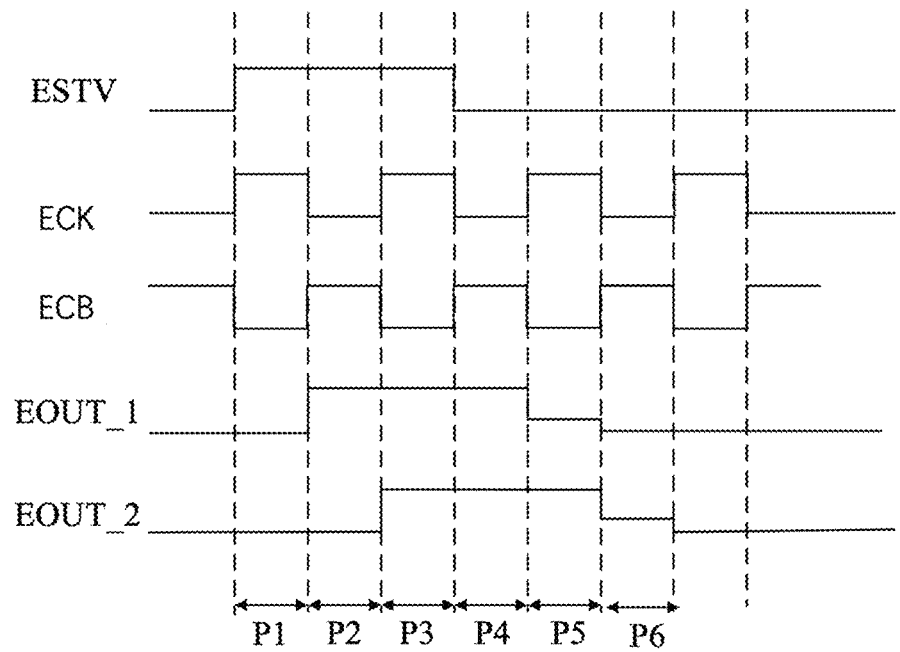
FIG. 1C is a signal timing diagram of the light-emitting control shift register unit illustrated in FIG. 1B in operation.

FIG. 1B is a circuit diagram of a light-emitting control shift register unit. FIG. 1C is a signal timing diagram of the light-emitting control shift register unit illustrated in FIG. 1B in operation. In the following, the operation process of the light-emitting control shift register unit is briefly described with reference to FIG. 1B and FIG. 1C.

As illustrated in FIG. 1B, the light-emitting control shift register unit 105 includes ten transistors (an input transistor T1, a first control transistor T2, a second control transistor T3, a second noise reduction transistor T4, a third noise reduction transistor T5, a third control transistor T6, a fourth control transistor T7, a first noise reduction transistor T8, an output transistor T9, and an output reset transistor T10) and three capacitors (a first capacitor C1, a second capacitor C2, and a third capacitor C3). For example, in the case where a plurality of light-emitting control shift register units 105 are cascaded, the second electrode of the input transistor T1 in the first light-emitting control shift register unit 105 is connected to the input terminal EI, the input terminal EI is configured to be connected to a trigger signal line ESTV to receive a trigger signal serving as the input signal, and the second electrode of the input transistor T1 in each other light-emitting control shift register unit 105 is electrically connected to the output terminal EOUT of the previous light-emitting control shift register unit 105 to receive the output signal, serving as the input signal, output by the output terminal EOUT of the previous light-emitting control shift register unit 105, so as to achieve shift output and provide such as the light-emitting control signals which are shifted row by row to the pixel units 103 arranged in an array in the display region 102 of the display panel 101.

In addition, as illustrated in FIG. 1B, the light-emitting control shift register unit further includes a first clock signal terminal CK and a second clock signal terminal CB. ECK represents a first clock signal line, and ECB represents a second clock signal line. For example, the first clock signal terminal CK is connected to the first clock signal line ECK or the second clock signal line ECB to receive a first clock signal. For example, in the case where the first clock signal terminal CK is connected to the first clock signal line ECK, the first clock signal line ECK provides the first clock signal; and in the case where the first clock signal terminal CK is connected to the second clock signal line ECB, the second clock signal line ECB provides the first clock signal. Specific implementation may depend on the actual situation, and the embodiments of the present disclosure are not limited in this aspect. Similarly, the second clock signal terminal CB is connected to the second clock signal line ECB or the first clock signal line ECK to receive a second clock signal. In the following, descriptions are given by taking the case where the first clock signal terminal CK is connected to the second clock signal line ECB to receive the first clock signal and the second clock signal terminal CB is connected to the first clock signal line ECK to receive the second clock signal as an example, and the embodiments of the present disclosure are not limited in this aspect. For example, the first clock signal and the second clock signal may adopt pulse signals with a duty cycle greater than 50%, and for example, the time difference between the first clock signal and the second clock signal may be half a cycle. For example, VGL represents a first power line and a first voltage provided by the first power line, VGH represents a second power line and a second voltage provided by the second power line, and the second voltage is greater than the first voltage. For example, the second voltage is a direct-current high level, and the first voltage is a direct-current low level. N1, N2, N3 and N4 respectively represent a first node, a second node, a third node, and a fourth node in the circuit diagram.

As illustrated in FIG. 1B, a gate electrode of the input transistor T1 is connected to the first clock signal terminal CK (the first clock signal terminal CK is connected to the second clock signal line ECB) to receive the first clock signal, a second electrode of the input transistor T1 is connected to the input terminal EI, and a first electrode of the input transistor T1 is connected to the first node N1. For example, in the case where the light-emitting control shift register unit is the first light-emitting control shift register unit, the input terminal EI is connected to the trigger signal line ESTV to receive the trigger signal; and in the case where the light-emitting control shift register unit is any other light-emitting control shift register unit except for the first light-emitting control shift register unit, the input terminal EI is connected to the output terminal EOUT of the previous light-emitting control shift register unit.

A gate electrode of the first control transistor T2 is connected to the first node a first electrode of the first control transistor T2 is connected to the second node N2, and a second electrode of the first control transistor T2 is connected to the first clock signal terminal CK to receive the first clock signal.

A gate electrode of the second control transistor T3 is connected to the first clock signal terminal CK to receive the first clock signal, a first electrode of the second control transistor T3 is connected to the second node N2, and a second electrode of the second control transistor T3 is connected to the first power line VGL to receive the first voltage.

A gate electrode of the second noise reduction transistor T4 is connected to the second clock signal terminal CB (for example, the second clock signal terminal CB is connected to the first clock signal line ECK) to receive the second clock signal, a first electrode of the second noise reduction transistor T4 is connected to the first node N1, and a second electrode of the second noise reduction transistor T4 is connected to a second electrode of the third noise reduction transistor T5.

A gate electrode of the third noise reduction transistor T5 is connected to the second node N2, and a first electrode of the third noise reduction transistor T5 is connected to the second power line VGH to receive the second voltage.

A gate electrode of the third control transistor T6 is connected to the second node N2, a first electrode of the third control transistor T6 is connected to the second clock signal terminal CB to receive the second clock signal, and a second electrode of the third control transistor T6 is connected to the third node N3.

A first electrode of the second capacitor C2 is connected to the second node N2, and a second electrode of the second capacitor C2 is connected to the third node N3.

A gate electrode of the fourth control transistor T7 is connected to the second clock signal terminal CB to receive the second clock signal, a first electrode of the fourth control transistor T7 is connected to the third node N3, and a second electrode of the fourth control transistor T7 is connected to the fourth node N4.

A gate electrode of the first noise reduction transistor T8 is connected to the first node N1, a first electrode of the first noise reduction transistor T8 is connected to the fourth node N4, and a second electrode of the first noise reduction transistor T8 is connected to the second power line VGH to receive the second voltage.

A gate electrode of the output transistor T9 is connected to the fourth node N4, a first electrode of the output transistor T9 is connected to the second power line VGH to receive the second voltage, and a second electrode of the output transistor T9 is connected to the output terminal EOUT.

A first electrode of the third capacitor C3 is connected to the fourth node N4, and a second electrode of the third capacitor C3 is connected to the second power line VGH to receive the second voltage.

A gate electrode of the output reset transistor T10 is connected to the first node N1, a first electrode of the output reset transistor T10 is connected to the first power line VGL to receive the first voltage, and a second electrode of the output reset transistor T10 is connected to the output terminal EOUT.

A first electrode of the first capacitor C1 is connected to the first node N1, and a second electrode of the first capacitor C1 is connected to the second clock signal terminal CB to receive the second clock signal.

Each transistor in the light-emitting control shift register unit 105 illustrated in FIG. 1B is described by taking a P-type transistor as an example, that is, each transistor is turned on in the case where the gate electrode of the transistor is provided with a low electrical level (a turned-on electrical level), and the transistor is turned off in the case where the gate electrode of the transistor is provided with a high electrical level (a turned-off electrical level). In this case, the first electrode of the transistor may be a source electrode, and the second electrode of the transistor may be a drain electrode.

The configuration of the light-emitting control shift register unit includes, but is not limited to, the configuration as illustrated in FIG. 1B. For example, the transistors of the light-emitting control shift register unit 105 may also adopt N-type transistors, or adopt both P-type transistors and N-type transistors, as along as the terminal polarity of the selected type of transistor is connected according to the terminal polarity of the corresponding transistor in the embodiments of the present disclosure.

It should be noted that, the transistors adopted in the light-emitting control shift register unit may be thin film transistors, field effect transistors, or other switching devices with the same characteristics. Here, descriptions are given by taking the case where the transistors adopted in the light-emitting control shift register unit are thin film transistors as an example. For example, the active layer (the channel region) of the transistor is made of a semiconductor material, such as polysilicon (such as low-temperature polysilicon or high-temperature polysilicon), amorphous silicon, indium gallium zinc oxide (IGZO), or the like, and the gate electrode, source electrode, and drain electrode of the transistor are made of a metal material, such as aluminum or aluminum alloy. The source electrode and drain electrode of the transistor adopted here can be symmetrical in structure, and therefore, there is no difference in structure between the source electrode and the drain electrode. In the embodiments of the present disclosure, in order to distinguish the two electrodes of the transistor except for the gate electrode, it is directly described that one electrode is the first electrode and the other electrode is the second electrode. In addition, in the embodiments of the present disclosure, the electrodes of the capacitor may be metal electrodes, or one of the electrodes of the capacitor may adopt a semiconductor material (such as doped polysilicon).

FIG. 1C is a signal timing diagram of the light-emitting control shift register unit 105 illustrated in FIG. 1B in operation. In the following, the operation process of the light-emitting control shift register unit is described in detail with reference to FIG. 1B and FIG. 1C. For example, the operation principle of the first light-emitting control shift register unit 105 will be described, the operation principle of other light-emitting control shift register units 105 is similar, and details will not be described again. As illustrated in FIG. 1C, the operation process of the light-emitting control shift register unit 105 includes six phases, which are respectively a first phase P1, a second phase P2, a third phase P3, a fourth phase P4, a fifth phase P5, and a sixth phase P6, and FIG. 1C illustrates timing waveforms of signals in each phase.

In the first phase P1, as illustrated in FIG. 1C, the second clock signal line ECB provides a low electrical level, and therefore, the first clock signal terminal CK connected to the second clock signal line ECB receives the first clock signal with a low electrical level. The input transistor T1 and the second control transistor T3 are turned on, the input transistor T1 that is turned on enables the trigger signal ESTV with a high electrical level to be transmitted to the first node N1, so as to change the level of the first node N1 into a high electrical level, and thus the first control transistor T2, the first noise reduction transistor T8, and the output reset transistor T10 are turned off. In addition, the second control transistor T3 that is turned on enables the first voltage with a low electrical level to be transmitted to the second node N2, so as to change the level of the second node N2 into a low electrical level, and thus the third noise reduction transistor T5 and the third control transistor T6 are turned on. Because the first clock signal line ECK provides a high electrical level, the second clock signal received by the second clock signal terminal CB connected to the first clock signal line ECK is a high electrical level, and the second noise reduction transistor T4 and the fourth control transistor T7 are turned off. In addition, because of the storage function of the third capacitor C3, the level of the fourth node N4 can be kept being a high electrical level, so as to enable the output transistor T9 to be turned off. In the first phase P1, because the output transistor T9 and the output reset transistor T10 are both turned off, the output signal output by the output terminal EOUT_1 of the light-emitting control shift register unit 105 is kept at a previous low electrical level.

In the second phase P2, as illustrated in FIG. 1C, the first clock signal line ECK provides the second clock signal with a low electrical level to the second clock signal terminal CB, and thus the second noise reduction transistor T4 and the fourth control transistor T7 are turned on. Because the second clock signal line ECB provides the first clock signal with a high electrical level to the first clock signal terminal, the input transistor T1 and the second control transistor T3 are turned off. Because of the storage function of the second capacitor C2, the second node N2 can maintain the low electrical level of the previous phase, and the third noise reduction transistor T5 and the third control transistor T6 are turned on. The second voltage VGH with a high electrical level is transmitted to the first node N1 through the third noise reduction transistor T5 and the second noise reduction transistor T4 which are turned on, so as to enable the level of the first node N1 to continue to be kept being the high electrical level of the previous phase, and thus the first control transistor T2, the first noise reduction transistor T8, and the output reset transistor T10 are turned off. In addition, the second clock signal with a low electrical level is transmitted to the fourth node N4 through the third control transistor T6 and the fourth control transistor T7 which are turned on, so as to change the level of the fourth node N4 into a low electrical level, and thus the output transistor T9 is turned on. The output transistor T9 that is turned on outputs the second voltage VGH with a high electrical level, and thus the output signal output by the output terminal EOUT_1 of the light-emitting control shift register unit 105 in the second phase P2 is a high electrical level.

In the third phase P3, as illustrated in FIG. 1C, the second clock signal line ECB provides the first clock signal with a low electrical level to the first clock signal terminal CK, and thus the input transistor T1 and the second control transistor T3 are turned on. The first clock signal line ECK provides the second clock signal with a high electrical level to the second clock signal terminal CB, and thus the second noise reduction transistor T4 and the fourth control transistor T7 are turned off. Because of the storage function of the third capacitor C3, the level of the fourth node N4 can maintain the low electrical level of the previous phase, so as to enable the output transistor T9 to be kept in a turn-on state. The output transistor T9 that is turned on outputs the second voltage VGH with a high electrical level, and thus the output signal output by the output terminal EOUT_1 of the light-emitting control shift register unit 105 in the third phase P3 is still a high electrical level. Meanwhile, in this phase, the output terminal EOUT_2 of the second light-emitting control shift register unit 105 outputs a high electrical level (detailed descriptions may be referred to the operation process of the first light-emitting control shift register unit 105 in the second phase P2 described above).

In the fourth phase P4, as illustrated in FIG. 1C, the second clock signal line ECB provides the first clock signal with a high electrical level to the first clock signal terminal CK, and thus the input transistor T1 and the second control transistor T3 are turned off. The first clock signal line ECK provides the second clock signal with a low electrical level to the second clock signal terminal CB, and thus the second noise reduction transistor T4 and the fourth control transistor T7 are turned on. Because of the storage function of the first capacitor C1, the level of the first node N1 is kept being the high electrical level of the previous phase, so as to enable the first control transistor T2, the first noise reduction transistor T8, and the output reset transistor T10 to be turned off. Because of the storage function of the second capacitor C2, the level of the second node N2 is kept being the low electrical level of the previous phase, so as to enable the third noise reduction transistor T5 and the third control transistor T6 to be turned on. In addition, the second clock signal with a low electrical level is transmitted to the fourth node N4 through the third control transistor T6 and the fourth control transistor T7 which are turned on, so as to change the level of the fourth node N4 into a low electrical level, and thus the output transistor T9 is turned on. The output transistor T9 that is turned on outputs the second voltage VGH with a high electrical level, and thus the output signal output by the output terminal EOUT_1 of the light-emitting control shift register unit 105 in the fourth phase P4 is still to be a high electrical level. Meanwhile, in this phase, the output terminal EOUT_2 of the second light-emitting control shift register unit 105 outputs a high electrical level (detailed descriptions may be referred to the operation process of the first light-emitting control shift register unit 105 in the third phase P3 described above).

In the fifth phase P5, as illustrated in FIG. 1C, the second clock signal line ECB provides the first clock signal with a low electrical level to the first clock signal terminal CK, and thus the input transistor T1 and the second control transistor T3 are turned on. The first clock signal line ECK provides the second clock signal with a high electrical level to the second clock signal terminal CB, and thus the second noise reduction transistor T4 and the fourth control transistor T7 are turned off. The input transistor T1 that is turned on enables the trigger signal ESTV with a low electrical level to be transmitted to the first node N1, so as to change the level of the first node N1 into a low electrical level.

For example, in the fifth phase P5, the voltage of the low electrical level of the first clock signal is −6V, the voltage of the low electrical level of the trigger signal ESTV is −6V, and the threshold voltage Vth of the input transistor T1 is −1.5V. Because the input transistor T1 is a P-type transistor, in order to enable the input transistor T1 to be turned on, the voltage Vgs between the gate electrode and the source electrode of the input transistor T1 is required to be smaller than the threshold voltage Vth of the input transistor T1. Therefore, in the case where the first node N1 is charged to be at −4.5V, the input transistor T1 is turned off, and at this moment, the charging of the first node N1 is stopped, that is, in this phase, the voltage of the low electrical level at the first node N1 is −4.5V, so that the first control transistor T2, the first noise reduction transistor T8, and the output reset transistor T10 are turned on. The first control transistor T2 that is turned on enables the first clock signal with a low electrical level to be transmitted to the second node N2, so as to further pull down the level of the second node N2, and thus the level of the second node N2 continues to be kept being the low electrical level of the previous phase, so as to enable the third noise reduction transistor T5 and the third control transistor T6 to be turned on. In addition, the first noise reduction transistor T8 that is turned on enables the second voltage VGH with a high electrical level to be transmitted to the fourth node N4, so as to change the level of the fourth node N4 into a high electrical level, and thus the output transistor T9 is turned off. The output reset transistor T10 that is turned on outputs the first voltage VGL with a low electrical level (for example, −6V) in response to the low electrical level (for example, −4.5V) at the first node N1. Similarly, the threshold voltage Vth of the output reset transistor T10 is −1.5V, in order to enable the output reset transistor T10 to be turned on, the voltage Vgs between the gate electrode and the source electrode of the output reset transistor T10 is required to be smaller than the threshold voltage Vth of the output reset transistor T10, and therefore, in the case where the voltage output by the output terminal EOUT_1 is −3V, the output reset transistor T10 is turned off. That is, in this phase, the voltage of the low electrical level of the output terminal EOUT_1 is −3V, and thus the output signal output by the output terminal EOUT_1 of the first light-emitting control shift register unit 105 in the fifth phase P5 is changed into a first low electrical level (for example, −3V). Meanwhile, in this phase, the output terminal EOUT_2 of the second light-emitting control shift register unit 105 outputs a high electrical level (detailed descriptions may be referred to the operation process of the first light-emitting control shift register unit 105 in the fourth phase P4 described above).

In the sixth phase P6, as illustrated in FIG. 1C, the second clock signal line ECB provides the first clock signal with a high electrical level to the first clock signal terminal CK, the first clock signal line ECK provides the second clock signal with a low electrical level to the second clock signal terminal CB, and thus the second noise reduction transistor T4 and the fourth control transistor T7 are turned on. Because the second clock signal is changed from a high electrical level in the fifth phase P5 into a low electrical level, and for example, the variation is Δt (for example, being greater than 6V), according to the bootstrap effect of the first capacitor C1, the level of the first node N1 is changed from a low electrical level (for example, −4.5V) in the fifth phase P5 into a low electrical level (for example, −4.5 V-Δt) with an even lower voltage value. Therefore, the first control transistor T2 and the output reset transistor T10 are turned on under control of the low electrical level (for example, −4.5V-Δt) of the first node N1, and according to the turn-on characteristics of the output reset transistor T10 described above, the first voltage VGL with a low electrical level (for example, −6V) can be completely output to the output terminal EOUT_1. For example, in the sixth phase P6, the voltage output by the output terminal EOUT_1 is a second low electrical level (for example, −6V). Meanwhile, in this phase, the output terminal EOUT_2 of the second light-emitting control shift register unit 105 outputs a low electrical level, for example, −3V (detailed descriptions may be referred to the operation process of the first light-emitting control shift register unit 105 in the fifth phase P5 described above).

With improvement of active matrix organic light-emitting diode (AMOLED) technology, more and more mobile terminals adopt an AMOLED panel as a display panel. At present, for the market, the AMOLED product with a narrow frame has more competitive advantages and is favored by more users. In addition to the influence of encapsulation technology, the size of the frame is also greatly limited by the overall size of the EM GOA (that is, the light-emitting control driving circuit array). The larger the size of the EM GOA, the larger the size of the left and right frame of the panel. Conversely, the smaller the size of the EM GOA, the smaller the size of the frame of the panel.

Figure 1D:
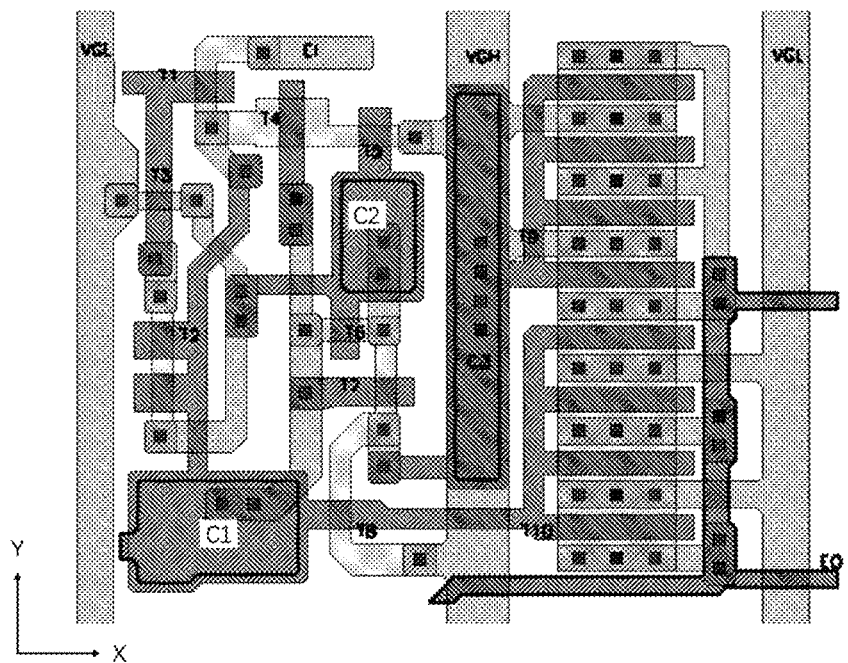
FIG. 1D is a schematic layout diagram of the light-emitting control shift register unit illustrated in FIG. 1B on a display substrate.

FIG. 1D is a schematic layout diagram of the light-emitting control shift register unit illustrated in FIG. 1B on a display substrate. It should be noted that, for clarity and conciseness, the first clock signal line ECK, the second clock signal line ECB, the trigger signal line ESTV, and the connection relationship among the above signal lines and respective transistors are not shown in FIG. 1D. For example, the gate electrode of the input transistor T1 may be connected to the second clock signal line ECB, which is located in a layer different from the gate electrode of the input transistor T1, through the via hole structure to receive the first clock signal, and the second electrode of the first capacitor C1 may be connected to the first clock signal line ECK, which is located in a layer different from the second electrode of the first capacitor C1, through the via hole structure to receive the second clock signal.

For example, in the display substrate illustrated in FIG. 1D, a lead wire (for example, a portion which is located between the first control transistor T2 and the second noise reduction transistor T4 in space and is integrally formed with the gate electrode of the first control transistor T2) connecting the gate electrode of the first control transistor T2 and the first electrode of the second noise reduction transistor T4, and a transfer-connection hole (used for connecting the first electrode of the second control transistor T3 with the gate electrode of the third control transistor T6 and the first electrode of the second capacitor C2) corresponding to the second node N2 are arranged in parallel substantially along the second direction X in space, that is, arranged left and right in the display substrate illustrated in FIG. 1D, thus occupying a large space in the second direction X and wasting the space of the display substrate, which is not conducive to the narrow frame of the display substrate.

In addition, the second capacitor C2 and the third capacitor C3 are spatially arranged side by side along the second direction X, that is, arranged left and right in the display substrate illustrated in FIG. 1D. For example, in the second direction X, the third capacitor C3 is arranged on the right side of the second capacitor C2. Thus, the second capacitor C2 and the third capacitor C3 occupy a large space in the second direction X, resulting in a waste of space on the display substrate, which is not conducive to the narrow frame of the display substrate.

At least one embodiment of the present disclosure provides a display substrate, and the display substrate includes: a base substrate, including a display region and a peripheral region on at least one side of the display region; and a shift register unit, a first clock signal line, and a second clock signal line, which are in the peripheral region of the base substrate. The first clock signal line and the second clock signal line extend along a first direction on the base substrate, and are configured to provide a first clock signal or a second clock signal to the shift register unit, respectively; the shift register unit includes an input circuit, a first node control circuit, a second node control circuit, a third node control circuit, a fourth node control circuit, and an output circuit; the input circuit is configured to input an input signal to a first node in response to the first clock signal; the second node control circuit is configured to input a first voltage or the first clock signal to a second node under control of the first clock signal and a level of the first node, so as to control a level of the second node; the first node control circuit is configured to input a second voltage to the first node under control of the second clock signal and the level of the second node, so as to perform noise reduction on the first node; the third node control circuit is configured to control a level of a third node in response to the level of the second node; the fourth node control circuit is configured to input the level of the third node to a fourth node under control of the second clock signal; the output circuit is configured to output the second voltage to an output terminal under control of a level of the fourth node; the second node control circuit includes a first control transistor, and the first control transistor includes a first gate electrode; the display substrate further includes a first connection wire, and the first connection wire includes a first portion and a second portion; the first portion of the first connection wire is connected to and integrally formed with the first gate electrode of the first control transistor, the first portion of the first connection wire extends along the first direction, and an orthographic projection of the first portion of the first connection wire on the base substrate is on a side of an orthographic projection of an active layer of the first control transistor on the base substrate away from the display region; and the second portion of the first connection wire is connected to and integrally formed with the first gate electrode of the first control transistor, the second portion of the first connection wire extends along a direction, opposite to an extending direction of the first portion of the first connection wire, in the first direction, and an orthographic projection of the second portion of the first connection wire on the base substrate is on a side of the orthographic projection of the active layer of the first control transistor on the base substrate close to the display region.

At least one embodiment of the present disclosure further provides a display device and a manufacturing method of a display substrate which correspond to the above-mentioned display substrate.

The display substrate provided by the above-mentioned embodiments of the present disclosure optimizes the connection between wires and the layout of structures in the shift register unit, and reduces the size of the shift register unit in a direction (for example, a second direction) different from the first direction, in which the first clock signal line and the second clock signal line extend, to a certain extent, thereby reducing the size of the shift register unit, facilitating design of the display substrate with the narrow frame, and further guaranteeing the display quality of the display substrate.

Hereinafter, the embodiments of the present disclosure and some examples thereof will be described in detail with reference to the drawings.

Figure 2:
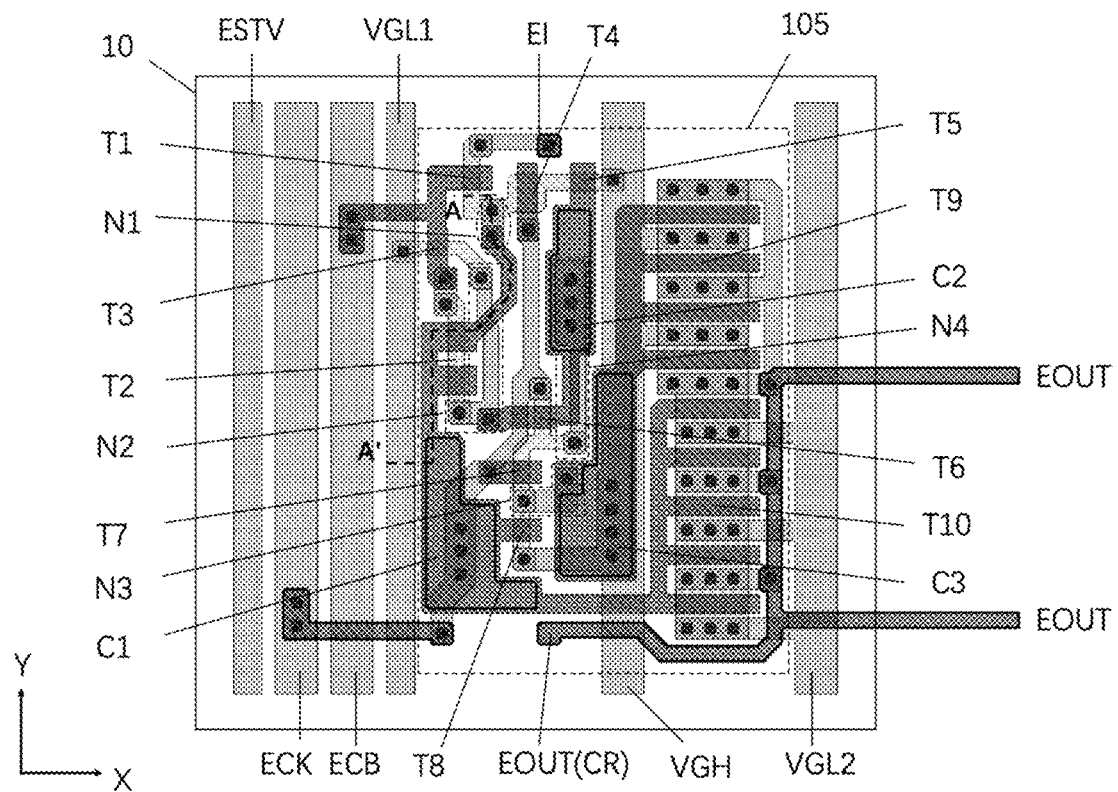
FIG. 2 is a schematic layout diagram of a display substrate provided by at least one embodiment of the present disclosure.

At least one embodiment of the present disclosure provides a display substrate. FIG. 2 is a schematic layout diagram of the light-emitting control shift register unit 105 illustrated in FIG. 1B in a display substrate.

For example, as illustrated in FIG. 2, the display substrate includes a base substrate 10 and further includes a shift register unit 105, a first power line VGL1, a second power line VGH, a third power line VGL2, and a plurality of clock signal lines (for example, a first clock signal line ECK, a second clock signal line ECB, and a trigger signal line ESTV as illustrated in FIG. 2) which are provided on the base substrate 10. For example, in the embodiments of the present disclosure, the shift register unit is the light-emitting control shift register unit 105. For convenience and conciseness, the light-emitting control shift register unit 105 is abbreviated as the shift register unit in the description below.

For example, the first power line VGL1, the second power line VGH, the third power line VGL2, and the plurality of clock signal lines (for example, the first clock signal line ECK, the second clock signal line ECB, and the trigger signal line ESTV) extend along the first direction Y on the base substrate 10, and are configured to respectively provide the first voltage, the second voltage, and the plurality of clock signals (for example, the first clock signal, the second clock signal, the trigger signal, or the like, as described above) to the shift register unit 105. For example, the first power line VGL1 and the third power line VGL2 are configured to provide the first voltage to the shift register unit 105, and the second power line VGH is configured to provide the second voltage to the shift register unit 105. The first clock signal line ECK and the second clock signal line ECB are configured to provide the first clock signal or the second clock signal to the shift register unit 105, respectively. For example, the first voltage is smaller than the second voltage. For example, the first voltage is a direct-current low electrical level, and the second voltage is a direct-current high electrical level. Specific connections of the shift register unit 105 with the first power line VGL1, the second power line VGH, the third power line VGL2, and the plurality of clock signal lines may refer to the following descriptions.

It should be noted that in the embodiments of the present disclosure, descriptions are given by taking the case where the first clock signal line ECK provides the second clock signal to the shift register unit 105 and the second clock signal line ECB provides the first clock signal to the shift register unit 105 as an example. The embodiments of the present disclosure include, but are not limited to, this case. In other embodiments of the present disclosure, the first clock signal line ECK may provide the first clock signal to the shift register unit 105, the second clock signal line ECB may provide the second clock signal to the shift register unit 105, and the embodiments of the present disclosure are not limited in this aspect.

It should be noted that, the first power line VGL1, the second power line VGH, the third power line VGL2, and the plurality of clock signal lines may be parallel to each other and extend along the first direction Y, or may be intersected with each other to form a certain angle (for example, the certain angle is smaller than or equal to 20 degrees), and the embodiments of the present disclosure are not limited in this aspect.

For example, the base substrate 10 may adopt such as glass, plastic, quartz, or other suitable materials, and the embodiments of the present disclosure are not limited in this aspect.

For example, the display substrate includes a display region 102 (for example, the display region 102 is also referred to as a pixel array region) and a peripheral region 106 located on at least one side of the pixel array region. For example, the first power line VGL1, the second power line VGH, the third power line VGL2, the plurality of clock signal lines, and the shift register unit 105, which are described above, are located in the peripheral region 106 of the base substrate 10 and located on one side of the base substrate 10 (as illustrated in FIG. 1A, located between the display region 102 and a side edge of the base substrate 10). For example, as illustrated in FIG. 1A, the shift register unit 105 is provided in the left side region of the base substrate 10, and certainly, the shift register unit 105 may also be provided in the right side region of the base substrate 10 or located in both the left side region and the right side region of the base substrate 10. The embodiments of the present disclosure are not limited in this aspect.

For example, the orthographic projection of the first power line VGL1 on the base substrate 10 and the orthographic projection of the plurality of clock signal lines on the base substrate 10 are located on a side of the orthographic projection of the shift register unit 105 on the base substrate 10 away from the display region 102. For example, in the second direction X, the first power line VGL1 and the plurality of clock signal lines are located on the left side of the shift register unit 105 as illustrated in FIG. 2. The orthographic projection of the third power line VGL2 on the base substrate 10 is on a side of the orthographic projection of the shift register unit 105 on the base substrate 10 close to the display region 102. For example, in the second direction X, the third power line VGL2 is on the right side of the shift register unit 105 as illustrated in FIG. 2, that is, the orthographic projection of the third power line VGL2 on the base substrate 10 is between the orthographic projection of the shift register unit 105 on the base substrate 10 and the display region 102. In other words, the orthographic projection of the shift register unit 105 on the base substrate 10 is located between the orthographic projection of the first power line VGL1 on the base substrate 10 and the orthographic projection of the third power line VGL2 on the base substrate 10. The orthographic projection of the second power line VGH on the base substrate 10 partially overlaps with the orthographic projection of the shift register unit 105 on the base substrate 10, and is located between the orthographic projection of the first power line VGL1 on the base substrate 10 and the orthographic projection of the third power line VGL2 on the base substrate 10.

For example, as illustrated in FIG. 2, the orthographic projection of the first power line VGL1 on the base substrate 10 is located between the orthographic projection of the first clock signal line ECK and the second clock signal line ECB on the base substrate 10 and the orthographic projection of the shift register unit 105 on the base substrate 10. For example, the first clock signal line ECK and the second clock signal line ECB are sequentially arranged from left to right along the second direction X on the base substrate 10, that is, the orthographic projection of the first clock signal line ECK on the base substrate 10 is located on a side of the orthographic projection of the second clock signal line ECB on the base substrate 10 away from the orthographic projection of the first power line VGL1 on the base substrate 10.

It should be noted that the plurality of clock signal lines described above may also include a trigger signal line ESTV for providing a trigger signal. For example, the orthographic projection of the trigger signal line ESTV on the base substrate 10 may be located on a side of the orthographic projection of the first clock signal line ECK and the second clock signal line ECB on the base substrate 10 away from the orthographic projection of the shift register unit 105 on the base substrate 10. That is, the trigger signal line ESTV, the first clock signal line ECK, and the second clock signal line ECB are sequentially arranged from the left to the right along the second direction X on the base substrate 10.

It should be noted that, the positions of the above-mentioned wires are only exemplary, as along as the arrangement of above-mentioned wires is in favor of the connection with the shift register unit, and the embodiments of the present disclosure are not limited in this aspect.

For example, the angle between the first direction Y and the second direction X ranges from 70° to 90°, and 70° and 90° are included. For example, the angle between the first direction Y and the second direction X may be 70°, 75°, 85°, 90°, 80°, or the like, the specific value of the angle between the first direction Y and the second direction X may be set according to the actual situation, and the embodiments of the present disclosure are not limited in this aspect.

For example, the display region 102 includes a plurality of pixel units 103 which are arranged in an array. For example, each of the plurality of pixel units 103 includes a pixel circuit, and for example, may further include a light-emitting element (not shown in the figure).

For example, the plurality of shift register units 105 (that is, the light-emitting control shift register units 105) which are cascaded form a light-emitting control driving circuit array (an EM GOA). For example, output terminals EOUT of the plurality of shift register units 105 are respectively connected to light-emitting control signal terminals of respective rows of pixel circuits in the pixel array region, so as to provide output signals (for example, light-emitting control signals) to the respective rows of pixel circuits, thereby driving the light-emitting elements to emit light. For example, the pixel circuits may be pixel circuits adopting a circuit structure, such as 7T1C (seven transistors and one capacitor), 2T1C (two transistors and one capacitor), 4T2C (four transistors and two capacitors), 8T2C (eight transistors and two capacitors), or the like in the art, and details are not described herein.

It should be noted that, FIG. 2 only illustrates a K-th shift register unit 105 (K is an even number that is greater than or equal to 2) in the gate driving circuit. For example, the first clock signal terminal CK (as illustrated in FIG. 1B) of the first shift register unit (not shown in the figure) is connected to the first clock signal line ECK to receive the first clock signal, the second clock signal terminal CB of the first shift register unit 105 is connected to the second clock signal line ECB to receive the second clock signal, the first clock signal terminal CK of the second shift register unit (not shown in the figure) is connected to the second clock signal line ECB to receive the first clock signal, the second clock signal terminal CB of the second shift register unit is connected to the first clock signal line ECK to receive the second clock signal, and so on. As illustrated in FIG. 2, the first clock signal terminal CK of the K-th shift register unit 105 (K is an even number that is greater than or equal to 2) is connected to the second clock signal line ECB to receive the first clock signal, the second clock signal terminal CB of the K-th shift register unit 105 is connected to the first clock signal line ECK to receive the second clock signal, the first clock signal terminal CK of the (K+1)-th shift register unit is connected to the first clock signal line ECK to receive the first clock signal, and the second clock signal terminal CB of the (K+1)-th shift register unit is connected to the second clock signal line ECB to receive the second clock signal. It should be noted that, the connection of each shift register unit with the clock signal lines may also adopt other connection methods in the art, and the embodiments of the present disclosure are not limited in this aspect. For example, the input terminal EI of the first shift register unit is connected to the trigger signal line ESTV to receive the trigger signal serving as the input signal, the input terminal of the second shift register unit is connected to the output terminal EOUT of the previous shift register unit (that is, the first shift register unit), and the connection for each other shift register unit is similar to the connection as described above. In the following, descriptions are given by taking the structure of the K-th shift register unit 105 as an example, and the embodiments of the present disclosure are not limited in this aspect.

For example, as illustrated in FIG. 1B, in some examples, the shift register unit 105 includes an input circuit 1041, a first node control circuit 1042, a second node control circuit 1043, a third node control circuit 1044, a fourth node control circuit 1045, and an output circuit 1046. In some other examples, the shift register unit 105 further includes an output reset circuit 1047 and a fourth node noise reduction circuit 1048.

The input circuit 1041 is configured to input the input signal to the first node N1 in response to the first clock signal. For example, the input circuit 1041 is connected to the input terminal EI, the first node N1, and the first clock signal terminal CK (the first clock signal terminal CK of the K-th shift register unit 105 is connected to the second clock signal line ECB to receive the first clock signal, and the first clock signal terminal CK of the (K+1)-th shift register unit is connected to the first clock signal line ECK to receive the first clock signal), and the input circuit 1041 is configured to be turned on under control of the first clock signal received by the first clock signal terminal CK, so as to enable the input terminal EI to be connected to the first node N1, so that the input signal received by the input terminal EI can be input to the first node N1. For example, the input circuit 1041 is implemented as the input transistor T1 as described above, the connection for the input transistor T1 may refer to the above description, and details are not described herein again.

The second node control circuit 1043 is configured to input the first voltage or the first clock signal to the second node N2 under control of the first clock signal and the level of the first node N1, so as to control the level of the second node N2. For example, the second node control circuit 1043 is connected to the first power line VGL1 (or the third power line VGL2), the first node N1, the first clock signal terminal CK, and the second node N2, and the second node control circuit 1043 is configured to be turned on under control of the first clock signal received by the first clock signal terminal CK and the level of the first node N1, so as to enable the first voltage provided by the first power line VGL1 or the first clock signal to be input to the second node N2 to control the level of the second node N2. For example, the second node control circuit 1043 is implemented as the first control transistor T2 and the second control transistor T3 as described above, the connections for the first control transistor T2 and the second control transistor T3 may refer to the above description, and details are not described herein again. It should be noted that, the second node control circuit 1043 is not limited to be connected to the first node N1, and may also be connected to other independent voltage terminals (which provide a voltage that is the same as the voltage at the first node N1), or be connected to a circuit that is the same as the input circuit and provided separately, and the embodiments of the present disclosure are not limited in this aspect. The connections for other circuits in the shift register unit are similar to that, and details are not described herein.

The first node control circuit 1042 is configured to input the second voltage to the first node N1 under control of the second clock signal and the level of the second node N2, so as to perform noise reduction on the first node N1. For example, the first node control circuit 1042 is connected to the second power line VGH, the second clock signal terminal CB (the second clock signal terminal CB of the K-th shift register unit 105 is connected to the first clock signal line ECK to receive the second clock signal, and the second clock signal terminal CB of the (K+1)-th shift register unit is connected to the second clock signal line ECB to receive the second clock signal), the second node N2, and the first node N1, and the first node control circuit 1042 is configured to be turned on under control of the second clock signal received by the second clock signal terminal CB and the level of the second node N2, so as to enable the second power line VGH to be connected to the first node N1 to input the second voltage provided by the second power line VGH to the first node N1, thereby performing noise reduction on the first node N1. For example, the first node control circuit 1042 is implemented as the second noise reduction transistor T4 and the third noise reduction transistor T5 as described above, the connections for the second noise reduction transistor T4 and the third noise reduction transistor T5 may refer to the above descriptions, and details are not described herein again. It should be noted that, the first node control circuit 1042 is not limited to be connected to the second node N2, and may also be connected to other independent voltage terminals (which provide a voltage that is the same as the voltage at the second node N2), or be connected to a circuit that is the same as the second node control circuit 1043 and provided separately, and the embodiments of the present disclosure are not limited in this aspect. The connections for other circuits in the shift register unit are similar to that, and details are not described herein.

The third node control circuit 1044 is configured to control the level of the third node N3 in response to the level of the second node N2. For example, the third node control circuit 1044 is connected to the second clock signal terminal CB, the second node N2, and the third node N3, and the third node control circuit 1044 is configured to be turned on in response to the level of the second node N2 to enable the second clock signal terminal CB to be connected to the third node N3, so as to control the level of the third node N3. For example, the third node control circuit 1044 is implemented as the third control transistor T6 and the second capacitor C2 as described above, the connections for the third control transistor T6 and the second capacitor C2 may refer to the above descriptions, and details are not described herein again. It should be noted that, the third node control circuit 1044 is not limited to be connected to the second node N2, and may also be connected to other independent voltage terminals (which provide a voltage that is the same as the voltage at the second node N2) or be connected to a circuit that is the same as the second node control circuit 1043 and provided separately, and the embodiments of the present disclosure are not limited in this aspect. The connections for other circuits in the shift register unit are similar to that, and details are not described herein.

The fourth node control circuit 1045 is configured to input the level of the third node N3 to the fourth node N4 under control of the second clock signal. For example, the fourth node control circuit 1045 is connected to the second clock signal terminal CB, the third node N3, and the fourth node N4, and is configured to be turned on under control of the second clock signal received by the second clock signal terminal CB, so as to enable the level of the third node N3 to be input to the fourth node N4.

The output circuit 1046 is configured to output the second voltage to the output terminal EOUT under control of the level of the fourth node N4. For example, the output circuit 1046 is connected to the fourth node N4, the output terminal EOUT, and the second power line VGH, and is configured to be turned on under control of the level of the fourth node N4, so as to connect the second power line VGH and the output terminal EOUT, so that the second voltage is output at the output terminal EOUT and serves as the output signal. For example, the output circuit 1046 is implemented as the output transistor T9 and the third capacitor C3 as described above, the connections for the output transistor T9 and the third capacitor C3 may refer to the above descriptions, and details are not described herein again. It should be noted that, the output circuit 1046 is not limited to be connected to the fourth node N4, and may also be connected to other independent voltage terminals (which provide a voltage that is the same as the voltage at the fourth node N4) or be connected to a circuit that is the same as the fourth node control circuit 1045 and provided separately, and the embodiments of the present disclosure are not limited in this aspect. The connections for other circuits in the shift register unit are similar to that, and details are not described herein.

The output reset circuit 1047 is configured to reset the output terminal EOUT under control of the level of the first node N1. For example, the output reset circuit 1047 is connected to the second clock signal terminal CB, the first node N1, the third power line VGL2 (or the first power line VGL1), and the output terminal EOUT, and the output reset circuit 1047 is configured to be turned on under control of the level of the first node N1 to enable the third power line VGL2 to be connected to the output terminal EOUT, so as to control the level of the output terminal EOUT to be a low electrical level, thereby avoiding the incorrect output during the non-output phase caused by the shift register unit 105. For example, the output reset circuit 1047 is implemented as the output reset transistor T10 and the first capacitor C1 as described above, the connections for the output reset transistor T10 and the first capacitor C1 may refer to the above descriptions, and details are not described herein again. It should be noted that, the output reset circuit 1047 is not limited to be connected to the first node N1, and may also be connected to other independent voltage terminals (which provide a voltage that is the same as the voltage at the first node N1) or be connected to a circuit that is the same as the input circuit 1041 and provided separately, and the embodiments of the present disclosure are not limited in this aspect. The connections for other circuits in the shift register unit are similar to that, and details are not described herein.

The fourth node noise reduction circuit 1048 is configured to perform noise reduction on the fourth node N4 under control of the level of the first node N1. For example, the fourth node noise reduction circuit 1048 is connected to the second power line VGH, the first node N1, and the fourth node N4, and is configured to be turned on under control of the level of the first node N1 to enable the fourth node N4 to be connected to the second power line VGH, so as to keep the voltage of the fourth node N4 at a high electrical level to perform noise reduction on the fourth node N4, thereby avoiding the incorrect output during the non-output phase caused by the shift register unit 105. For example, the fourth node noise reduction circuit 1048 may be implemented as the first noise reduction transistor T8 as described above, the connection for the first noise reduction transistor T8 may refer to the above description, and details are not described herein again. It should be noted that, the fourth node noise reduction circuit 1048 is not limited to be connected to the first node N1, and may also be connected to other independent voltage terminals (which provide a voltage that is the same as the voltage at the first node N1) or be connected to a circuit that is the same as the input circuit 1041 and provided separately, and the embodiments of the present disclosure are not limited in this aspect. The connections for other circuits in the shift register unit are similar to that, and details are not described herein.

It should be noted that, the embodiments of the present disclosure illustratively show only two clock signal lines (the first clock signal line ECK and the second clock signal line ECB), the display substrate provided by the embodiments of the present disclosure may include 4, 6, 8, or more clock signal lines, and the embodiments of the present disclosure are not limited in this aspect. Correspondingly, in the case where the number of the clock signal lines is changed, the connection of the shift register unit 105 in the display substrate with the clock signal lines may also be changed accordingly, details may refer to the conventional design in the art, and details are not described herein.

Figure 3:
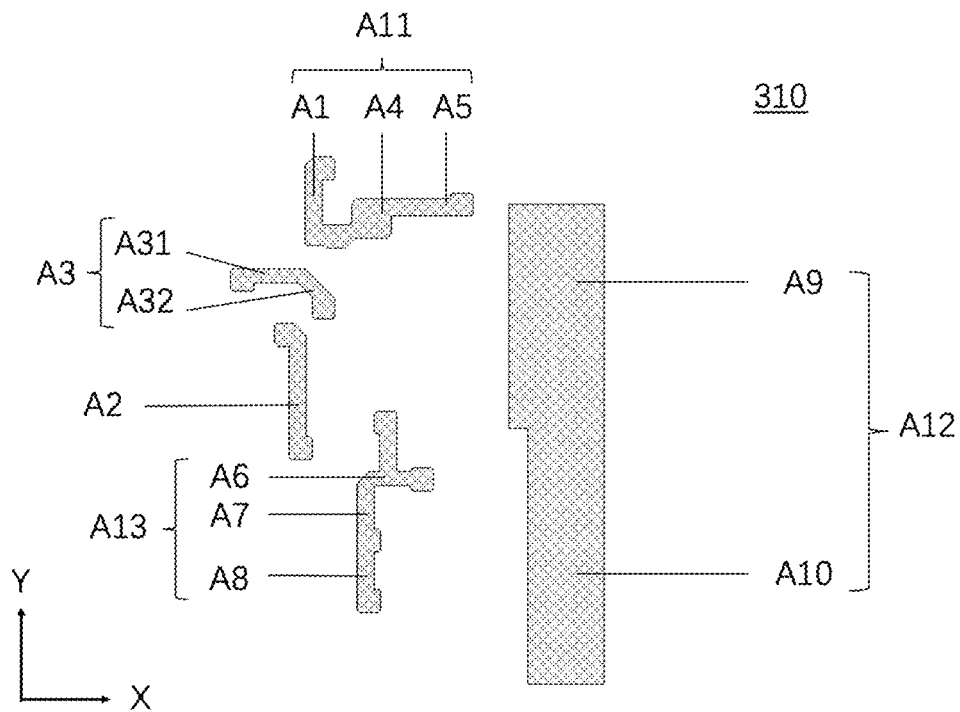
FIG. 3 is a planar diagram of a semiconductor layer of a display substrate provided by at least one embodiment of the present disclosure.
Figure 4:
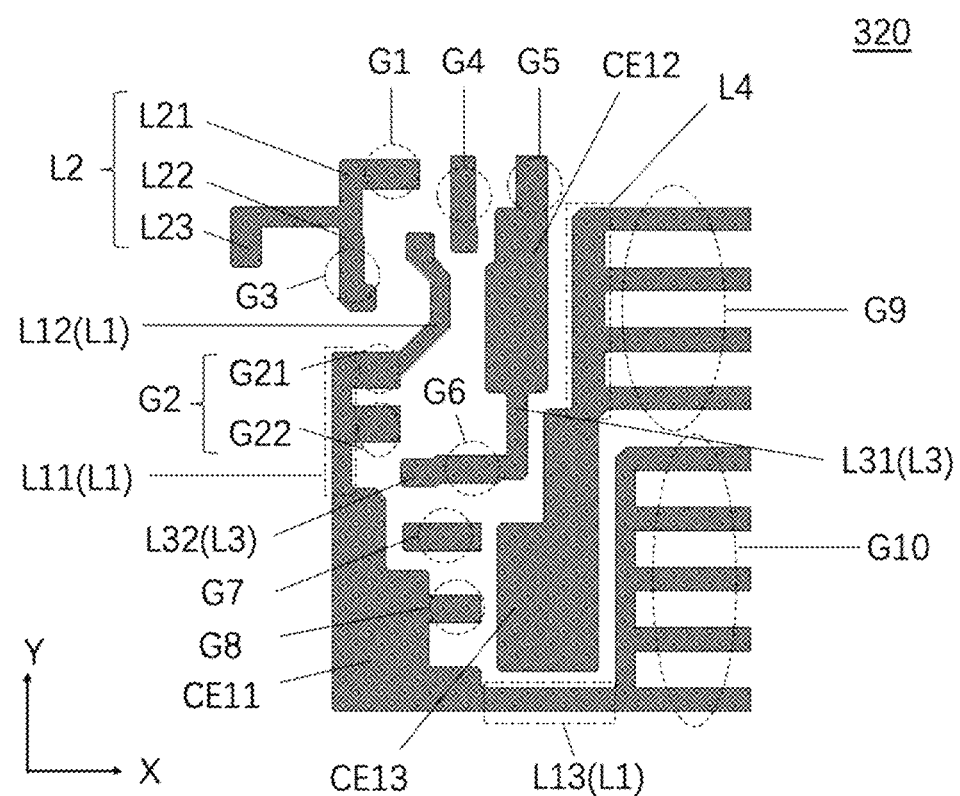
FIG. 4 is a planar diagram of a first conductive layer of a display substrate provided by at least one embodiment of the present disclosure.
Figure 5:
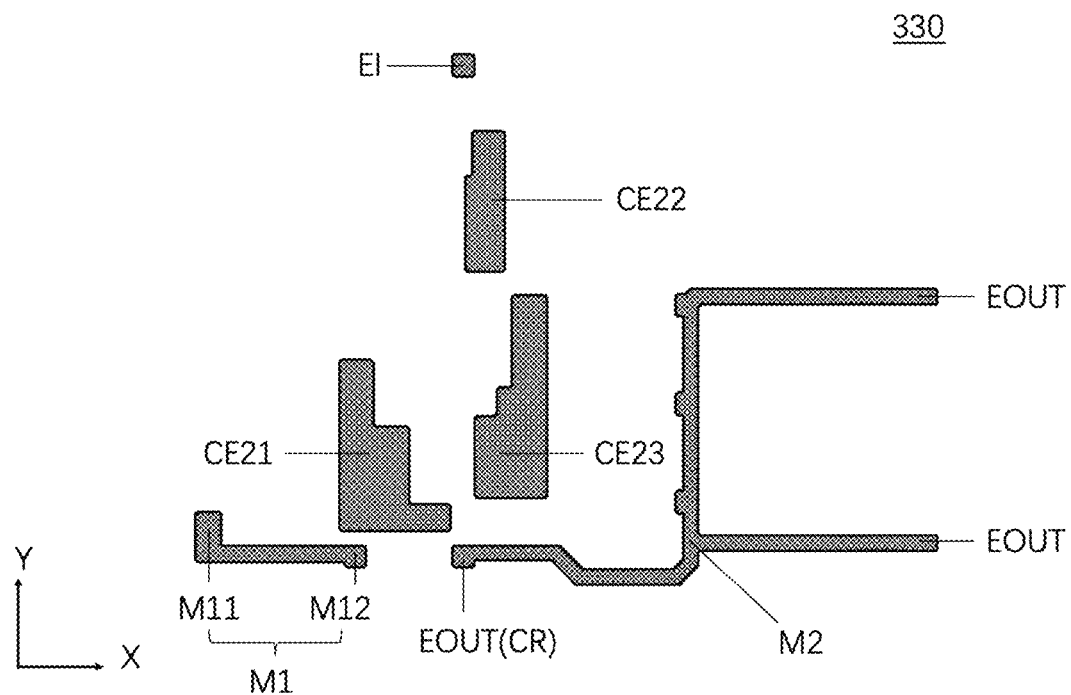
FIG. 5 is a planar diagram of a second conductive layer of a display substrate provided by at least one embodiment of the present disclosure.
Figure 6:
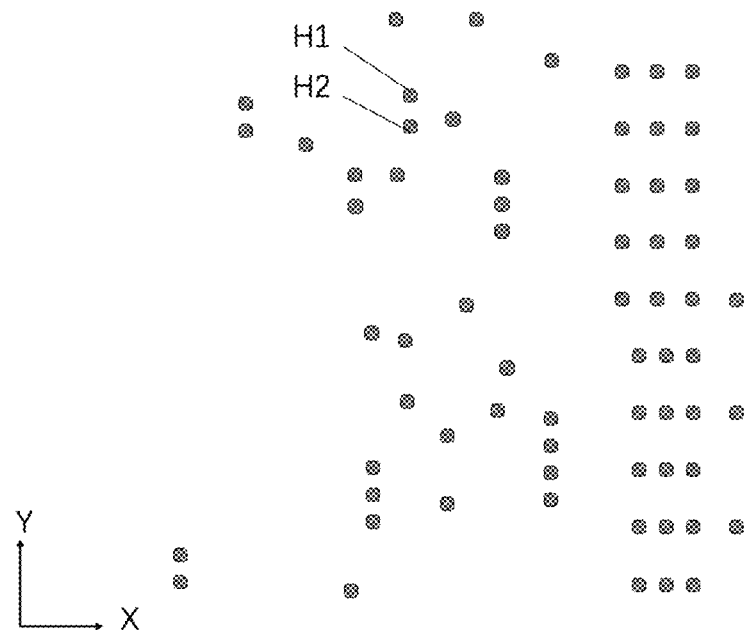
FIG. 6 is a diagram of distribution of via holes of a display substrate provided by at least one embodiment of the present disclosure.
Figure 7:
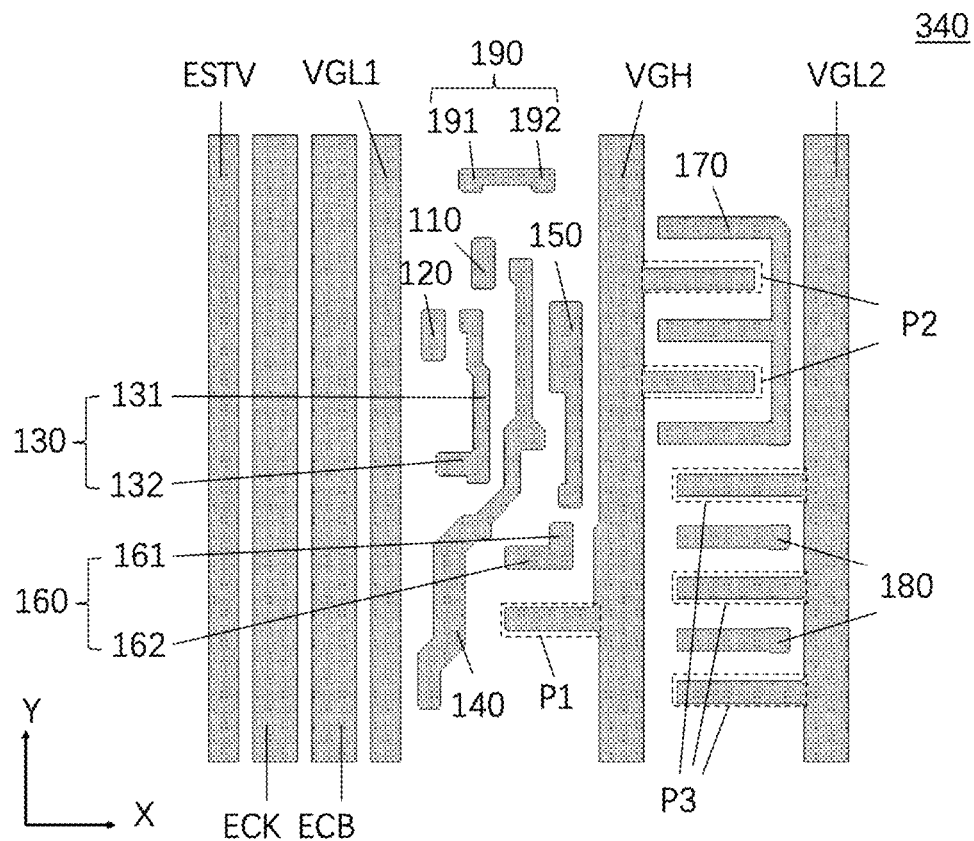
FIG. 7 is a planar diagram of a third conductive layer of a display substrate provided by at least one embodiment of the present disclosure.
Figure 8:
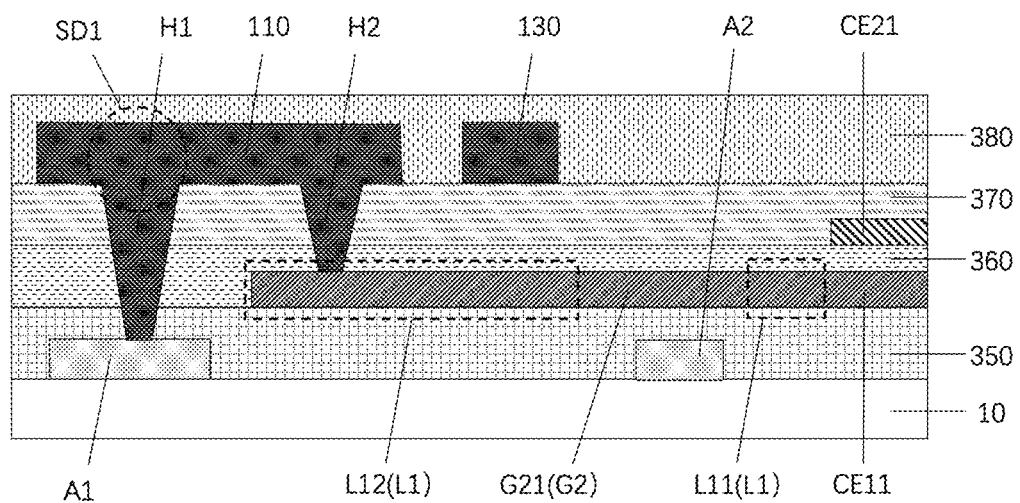
FIG. 8 is a cross-sectional view of the display substrate illustrated in FIG. 2 along an A-A' direction in some examples.

FIG. 3, FIG. 4, FIG. 5, and FIG. 7 respectively illustrate planar diagrams of wiring in layers of the display substrate as illustrated in FIG. 2. FIG. 3 is a planar diagram of a semiconductor layer of a display substrate provided by at least one embodiment of the present disclosure, FIG. 4 is a planar diagram of a first conductive layer of a display substrate provided by at least one embodiment of the present disclosure, FIG. 5 is a planar diagram of a second conductive layer of a display substrate provided by at least one embodiment of the present disclosure, FIG. 6 is a diagram of distribution of via holes of a display substrate provided by at least one embodiment of the present disclosure, and FIG. 7 is a planar diagram of a third conductive layer of a display substrate provided by at least one embodiment of the present disclosure. FIG. 8 is a cross-sectional view of the display substrate illustrated in FIG. 2 along an A-A' direction in some examples. In the following, the laminated structure of the display substrate provided by at least one embodiment of the present disclosure is described in detail with reference to FIG. 3 to FIG. 8.

For example, an interlayer insulating layer (for example, including a first insulating layer, a second insulating layer, a third insulating layer, etc.) of the display substrate may be provided between the layers as illustrated in FIG. 3 to FIG. 7. For example, the first insulating layer 350 (as illustrated in FIG. 8) is provided between the semiconductor layer 310 as illustrated in FIG. 3 and the first conductive layer 320 as illustrated in FIG. 4, the second insulating layer 360 (as illustrated in FIG. 8) is provided between the first conductive layer 320 as illustrated in FIG. 4 and the second conductive layer 330 as illustrated in FIG. 5, and the third insulating layer 370 (as illustrated in FIG. 8) is provided between the second conductive layer 330 as illustrated in FIG. 5 and the third conductive layer 340 as illustrated in FIG. 7. The via hole as illustrated in FIG. 6 is a via hole penetrating through one or more layers of the first insulating layer 350, the second insulating layer 360, and the third insulating layer 370.

For example, as illustrated in FIG. 8, the display substrate further includes a fourth insulating layer 380, and the fourth insulating layer 380 is located on the third conductive layer 340, that is, located on a side of the third conductive layer 340 away from the base substrate 10, and is used for protecting the third conductive layer 340.

For example, the materials of the first insulating layer 350, the second insulating layer 360, the third insulating layer 370, and the fourth insulating layer 380 may include such as an inorganic insulating material, for example, $SiN_x$, $SiO_x$, $SiN_xO_y$, or the like, and may also include such as an organic insulating material, for example, organic resin or the like, or other suitable materials, and the embodiments of the present disclosure are not limited in this aspect.

It should be noted that, the display substrate as illustrated in FIG. 2 is described by taking the layout design for the K-th shift register unit in the light-emitting control driving circuit array, and the first power line, the second power line, the third power line, and the clock signal lines which are connected to the K-th shift register unit as an example, the implementation of the layout for other shift register units may refer to the layout design as illustrated in FIG. 2, and details are not described herein. Certainly, other suitable layouts may also be adopted, and the embodiments of the present disclosure are not limited in this aspect. Certainly, the layout of the shift register unit in each other light-emitting control driving circuit array may also refer to the layout illustrated in FIG. 2, or may adopt other suitable methods, and the embodiments of the present disclosure are not limited in this aspect.

In the following, the display substrate provided by at least one embodiment of the present disclosure is described in detail with reference to FIG. 2 to FIG. 8.

For example, the active layers A1 to A10 of the input transistor T1 to the output reset transistor T10 of the shift register unit 105 as illustrated in FIG. 2 may be formed in the semiconductor layer 310 as illustrated in FIG. 3. The semiconductor layer 310 may be formed through a patterning process for a semiconductor material. For example, as illustrated in FIG. 3, according to different actual needs, the semiconductor layer 310 may include a part with a rod-like shape or a part with a curved or bent shape, so as to be used for forming the active layers A1 to A10 of the input transistor T1 to the output reset transistor T10 described above.

The active layer of each transistor may include a source electrode region, a drain electrode region, and a channel region between the source electrode region and the drain electrode region. For example, the channel region has the semiconductor characteristics, the source electrode region and the drain electrode region are on two sides of the channel region and may be doped with impurities, and thus the source electrode region and the drain electrode region are conductive. For example, the source electrode region is a part of the active layer, and the metal electrode (for example, in the third conductive layer 340) in contact with the source electrode region corresponds to the source electrode (or referred to as the first electrode) of the transistor; and the drain electrode region is a part of the active layer, the metal electrode (for example, in the third conductive layer 340) in contact with the drain electrode region corresponds to the drain electrode (or referred to as the second electrode) of the transistor. For example, the source electrode region is connected to the corresponding metal electrode (the source electrode) through a via hole penetrating through the first insulating layer 350, the second insulating layer 360, and the third insulating layer 370, and the drain electrode region is connected to the corresponding metal electrode (the drain electrode) through a via hole penetrating through the first insulating layer 350, the second insulating layer 360, and the third insulating layer 370.

For example, the material of the semiconductor layer 310 may include an oxide semiconductor, an organic semiconductor, amorphous silicon, polysilicon, or the like. For example, the oxide semiconductor includes a metal oxide semiconductor (for example, indium gallium zinc oxide (IGZO)), the polysilicon includes the low temperature polysilicon, high temperature polysilicon, or the like, and the embodiments of the present disclosure are not limited in this aspect. It should be noted that, the above-mentioned source electrode region and drain electrode region may be regions doped with n-type impurities or p-type impurities, and the embodiments of the present disclosure are not limited in this aspect.

It should be noted that, in some other examples, the first electrode and the second electrode of the transistor may be in other conductive layers, and are connected to corresponding regions of the active layer through via holes in the insulating layer(s) between the semiconductor layer and the first and second electrodes, and the embodiments of the present disclosure are not limited in this aspect.

FIG. 4 illustrates the first conductive layer 320 of the display substrate, and the first conductive layer 320 is provided on the first insulating layer 350, so as to enable the first conductive layer 320 to be insulated from the semiconductor layer 310. For example, the first conductive layer 320 may include the first electrodes CE11, CE12, CE13 of the first capacitor C1 to the third capacitor C3, the gate electrodes G1 to G10 of the input transistor T1 to the output reset transistor T10, and the wires (for example, the first connection wire L1, the second connection wire L2, the third connection wire L3, and the fourth connection wire L4) which are directly connected to the gate electrodes G1 to G10. Correspondingly, the first insulating layer 350 may also serve as a gate insulating layer. As illustrated in FIG. 4, the gate electrodes G1 to G10 of the input transistor T1 to the output reset transistor T10 are portions which are circled by a circular or oval dotted line, that is, the gate electrodes are portions, which overlap with semiconductor layer structures of the transistors, of electrodes or wires in the first conductive layer 320.

FIG. 5 illustrates the second conductive layer 330 of the display substrate, and the second conductive layer 330 includes the second electrodes CE21, CE22, CE23 of the first capacitor C1 to the third capacitor C3, and connection electrodes (e.g., a first connection electrode M1 and a second connection electrode M2) for connecting with such as signal lines or transfer-connection electrodes in the third conductive layer 340. For example, the second electrode CE21 at least partially overlaps with the first electrode CE11 to form the first capacitor C1, the second electrode CE22 at least partially overlaps with the first electrode CE12 to form the second capacitor C2, and the second electrode CE23 at least partially overlaps with the first electrode CE13 to form the third capacitor C3. For example, the second connection electrode M2 includes the output terminal EOUT. For example, the second conductive layer 330 further includes the input terminal EI.

It should be noted that in the embodiments of the present disclosure, the second connection electrode M2 located in the second conductive layer 330 can be used to provide the output signal. In other embodiments of the present disclosure, the output signal of the output terminal EOUT of the shift register unit 105 can also be provided by an electrode located in other layers, that is, the output terminal EOUT may also be provided in other layers different from the second conductive layer 330, for example, provided in the first conductive layer 320. The embodiments of the present disclosure are not limited in this aspect.

FIG. 7 illustrates the third conductive layer 340 of the display substrate, and the third conductive layer 340 includes the signal lines (for example, the first clock signal line ECK, the second clock signal line ECB, and the trigger signal line ESTV), the second power line VGH, the first power line VGL1, the third power line VGL2, etc. It should be noted that, the third conductive layer 340 further includes a first transfer-connection electrode 110, a second transfer-connection electrode 120, a third transfer-connection electrode 130, a fourth transfer-connection electrode 140, a fifth transfer-connection electrode 150, a sixth transfer-connection electrode 160, a seventh transfer-connection electrode 170, an eighth transfer-connection electrode 180, a ninth transfer-connection electrode 190, or the like, which are used for connecting the transistors, capacitors, and signal lines. For example, the ninth transfer-connection electrode 190 may be connected to the input terminal EI in the second conductive layer 330 through a via hole structure.

It should be noted that in some other embodiments of the present disclosure, the input terminal EI of the shift register unit 105 may also be located in other layers, for example, located in the third conductive layer 340 to be directly connected to the ninth transfer-connection electrode 190. For example, the ninth transfer-connection electrode 190 may be integrally formed with the input terminal EI, for example, the ninth transfer-connection electrode 190 includes the input terminal EI, and the embodiments of the present disclosure are not limited in this aspect.

As illustrated in FIG. 2 to FIG. 7, the signal lines, the second power line VGH, the first power line VGL1, and the third power line VGL2 are connected to transistors and capacitors, which are in other layers and required to be connected to the signal lines, the second power line VGH, the first power line VGL1, and the third power line VGL2, through at least one via hole as illustrated in FIG. 6. The respective transistors and capacitors may also be correspondingly connected with each other through at least one via hole or through bridge connection of the transfer-connection electrode, and details are not described herein.

For example, the material of the above-mentioned third conductive layer 340 may include titanium, titanium alloy, aluminum, aluminum alloy, copper, copper alloy, or any other suitable composite materials, and the embodiments of the present disclosure are not limited in this aspect. For example, the materials of the first conductive layer 320 and the second conductive layer 330 may be the same as the material of the third conductive layer 340, and details are not described herein.

FIG. 2 is a schematic diagram illustrating the position relationship for a stack of the semiconductor layer 310 as illustrated in FIG. 3, the first conductive layer 320 as illustrated in FIG. 4, the second conductive layer 330 as illustrated in FIG. 5, and the third conductive layer 340 as illustrated in FIG. 7. In the following, the display substrate provided by at least one embodiment of the present disclosure is described in detail with reference to FIG. 2 to FIG. 8.

For example, as illustrated in FIG. 2, FIG. 3 and FIG. 4, in at least one example, the first control transistor T2 includes a first gate electrode G21, that is, the gate electrode G2 of the first control transistor T2 includes the first gate electrode G21. The display substrate further includes a first connection wire L1, and the first connection wire L1 includes a first portion L11 and a second portion L12. The first portion L11 of the first connection wire L1 is connected to and integrally formed with the first gate electrode G21 of the first control transistor T2, the first portion L11 of the first connection wire L1 extends along the first direction Y, and the orthographic projection of the first portion L11 of the first connection wire L1 on the base substrate 10 is located on a side of the orthographic projection of the active layer A2 of the first control transistor T2 on the base substrate 10 away from the display region 102. For example, in the second direction X, the first portion L11 is located on the left side of the active layer A2 of the first control transistor T2. The second portion L12 of the first connection wire L1 is connected to and integrally formed with the first gate electrode G21 of the first control transistor T2. The second portion L12 of the first connection wire L1 extends along a direction, opposite to the extending direction of the first portion L11 of the first connection wire L1, in the first direction Y. For example, the included angle between the extending direction of the second portion L12 and the extending direction of the first portion L11 may range from 120 degrees to 180 degrees. The orthographic projection of the second portion L12 of the first connection wire L1 on the base substrate 10 is located on a side of the orthographic projection of the active layer A2 of the first control transistor T2 on the base substrate 10 close to the display region 102. For example, in the second direction X, the second portion L12 is located on the right side of the active layer A2 of the first control transistor T2.

For example, the included angle between the extending direction of the second portion L12 and the extending direction of the first portion L11 may be 120 degrees, 135 degrees, 160 degrees, 180 degrees, or the like, which may depend on the actual situation, and the embodiments of the present disclosure are not limited in this aspect.

Therefore, by optimizing the structure layout of the first connection wire L1 in the shift register unit 105, the size of the shift register unit 105 in the second direction X can be reduced to a certain extent, so that the size of the shift register unit 105 is reduced, which facilitates the narrow frame design of the display substrate, and further the display quality of the display substrate can be ensured. In addition, by arranging the first portion L11 of the first connection wire L1 on the left side of the active layer A2 of the first control transistor T2 in the second direction X, that is, by arranging the first portion L11 of the first connection wire L1 on the side of the active layer A2 of the first control transistor T2 close to the signal line, more space can be reserved for other transistors, capacitors, wires, etc. in the shift register unit 105, so that the wire connection and structural layout of the shift register unit can be further optimized.

For example, as illustrated in FIG. 2 and FIG. 4, the first control transistor T2 further includes a second gate electrode G22, that is, the gate electrode G2 of the first control transistor T2 includes the first gate electrode G21 and the second gate electrode G22, and the first control transistor T2 has a double-gate structure. The first gate electrode G21 and the second gate electrode G22 of the first control transistor T2 are arranged in parallel in the first direction Y, and the second gate electrode G22 of the first control transistor T2 is connected to and integrally formed with the first portion L11 of the first connection wire L1. Therefore, the gate electrode G2 of the first control transistor T2 forms a "U" shape structure through the first portion L11, thereby improving the stability and performance of the first control transistor T2.

Certainly, in other examples, the active layer of the first control transistor T2 may form a "U" shape structure, and the gate electrode of the first control transistor T2 may adopt a linear shape structure overlapping with the active layer in the "U" shape, so as to form the double-gate structure. The embodiments of the present disclosure are not limited in this aspect, as along as the arrangement of other structures is not adversely influenced and the size of the shift register unit is not increased too much. It should be noted that, the active layer of the first control transistor T2 may also overlap with one single gate electrode, and the embodiments of the present disclosure are not limited in this aspect.

For example, as illustrated in FIG. 2, FIG. 3 and FIG. 4, the first electrode CE11 of the first capacitor C1 is connected to and integrally formed with the first portion L11 of the first connection wire L1. The orthographic projection of the first electrode CE11 of the first capacitor C1 on the base substrate 10 is located on an imaginary line, in the first direction Y, of the orthographic projection of the active layer A2 of the first control transistor T2 on the base substrate 10. For example, the orthographic projection of the first electrode CE11 of the first capacitor C1 on the base substrate 10 is located below the orthographic projection of the active layer A2 of the first control transistor T2 on the base substrate 10.

For example, the orthographic projection of the active layer A10 of the output reset transistor T10 on the base substrate 10 is located on a side of the orthographic projection of the first capacitor C1 on the base substrate 10 close to the display region 102. For example, in the second direction X, the active layer A10 of the output reset transistor T10 is located on the right side of the first capacitor C1.

For example, as illustrated in FIG. 2 and FIG. 4, the first connection wire L1 further includes a third portion L13, and the third portion L13 is connected to and integrally formed with the first electrode CE11 of the first capacitor C1 and the gate electrode G10 of the output reset transistor T10. For example, in the second direction X, the third portion L13 of the first connection wire L1 is located between the first electrode CE11 of the first capacitor C1 and the gate electrode G10 of the output reset transistor T10. The gate electrode G10 of the output reset transistor T10 includes a plurality of sub-gate electrodes arranged in parallel in the first direction Y. For example, the gate electrode G10 of the output reset transistor T10 is comb-shaped in the first direction Y to improve the stability of the output reset transistor T10.

For example, as illustrated in FIG. 2 and FIG. 3, the active layer A1 of the input transistor T1 extends along the first direction Y, the active layer A2 of the first control transistor T2 extends along the first direction Y, and the orthographic projection of the active layer A1 of the input transistor T1 on the base substrate 10 is located on a side of the orthographic projection of the active layer A2 of the first control transistor T2 on the base substrate 10 away from the orthographic projection of the first capacitor C1 on the base substrate 10 and close to the display region 102. For example, the input transistor T1 is spatially located on the upper right side of the first control transistor T2 along the first direction Y.

For example, as illustrated in FIG. 2, FIG. 7 and FIG. 8, the display substrate further includes a first transfer-connection electrode 110, a first terminal of the first transfer-connection electrode 110 is connected to the second portion L12 of the first connection wire L1 through a via hole H2 penetrating through the second insulating layer 360 and the third insulating layer 370, and a second terminal of the first transfer-connection electrode 11 is connected to the first electrode SD1 of the input transistor T1. For example, the first electrode SD1 of the input transistor T1 is connected to the active layer A1 of the input transistor T1 through a via hole H1 penetrating through the first insulating layer 350, the second insulating layer 360, and the third insulating layer 370. For example, the first electrode SD1 of the input transistor T1 is connected to a region (e.g., a source electrode region) corresponding to the first electrode SD1 in the active layer A1.

For example, the first transfer-connection electrode 110 may serve as the first node N1 in the circuit structure illustrated in FIG. 1B.

For example, as illustrated in FIG. 2 and FIG. 3, the active layer A3 of the second control transistor T3 includes a first portion A31 and a second portion A32 which are integrally formed. The first portion A31 of the second control transistor T3 extends along a direction different from the first direction, and for example, extends along the second direction X. The second portion A32 of the second control transistor T3 extends along the first direction Y. For example, the extending direction of the second portion A32 may approach the first direction Y. For example, as illustrated in FIG. 3, the extending direction of the second portion A32 may form an included angle with the first direction Yin a certain range, such as 10 degrees to 60 degrees, for example, 10 degrees, 30 degrees, 45 degrees, 60 degrees, etc. The orthographic projection of the active layer A3 of the second control transistor T3 on the base substrate 10 is located between the orthographic projection of the active layer A1 of the input transistor T1 on the base substrate 10 and the orthographic projection of the active layer A2 of the first control transistor T2 on the base substrate 10.

For example, as illustrated in FIG. 2 and FIG. 4, the display substrate further includes a second connection wire L2 in a substantially "Y" shape, and the second connection wire L2 is connected to and integrally formed with the gate electrode G1 of the input transistor T1 and the gate electrode G3 of the second control transistor T3. The first terminal L21 of the second connection wire L2 is connected to the gate electrode G1 of the input transistor T1, the second terminal L22 of the second connection wire L2 is connected to the gate electrode G3 of the second control transistor T3, and the third terminal L23 of the second connection wire L2 is connected to the second clock signal line CLB through a via hole penetrating through the second insulating layer 360 and the third insulating layer 370 to receive the first clock signal.

It should be noted that in some other embodiments of the present disclosure, the third terminal L23 of the second connection wire L2 may also be connected to the first clock signal line CLK through a via hole penetrating through the second insulating layer 360 and the third insulating layer 370 to receive the first clock signal, and the embodiments of the present disclosure are not limited in this aspect.

For example, as illustrated in FIG. 2 and FIG. 7, the display substrate further includes a second transfer-connection electrode 120, the first terminal of the second transfer-connection electrode 120 is connected to the second electrode of the first control transistor T2, and the gate electrode G3 of the second control transistor T3 is connected to the second terminal of the second transfer-connection electrode 120 through a via hole penetrating through the second insulating layer 360 and the third insulating layer 370.

For example, as illustrated in FIG. 2, FIG. 4 and FIG. 7, the first power line VGL1 is connected to the second electrode of the second control transistor T3, and the orthographic projection of the first power line VGL1 on the base substrate 10 is located on a side of the orthographic projection of the gate electrode G3 of the second control transistor T3 on the base substrate 10 away from the display region 102. That is, in the second direction X, the second control transistor T3 is located on the right side of the first power line VGL1.

For example, as illustrated in FIG. 2, FIG. 3 and FIG. 4, the orthographic projection of the active layer A6 of the third control transistor T6 on the base substrate 10 and the orthographic projection of the second capacitor C2 on the base substrate 10 are located on a side of the orthographic projection of the active layer A2 of the first control transistor T2 on the base substrate 10 close to the display region 102, and the orthographic projection of the second capacitor C2 on the base substrate 10 is located on a side of the orthographic projection of the active layer A6 of the third control transistor T6 on the base substrate 10 away from the orthographic projection of the first capacitor C1 on the base substrate 10. The gate electrode G6 of the third control transistor T6 extends along the second direction X different from the first direction Y, and the active layer of the third control transistor T6 extends along the first direction Y. Thus, by allowing the gate electrode G6 of the third control transistor T6 to extend along the second direction X, sufficient space can be provided for the structural layout of the fourth control transistor T7 and the first noise reduction transistor T8 in the shift register unit 105, so as to further optimize the circuit connection and structural layout of the shift register unit 105, thereby reducing the size of the shift register unit 105 and further facilitating the narrow frame design of the display substrate.

Therefore, the active layer A6 of the third control transistor T6 can extend substantially along the first direction Y, and the gate electrode G6 of the third control transistor T6 can also be used as a part of the third connection wire L3, thereby reducing the space that needs to be occupied by the third control transistor T6 and further reducing the space that needs to be occupied by the third transfer-connection electrode 130 (for example, the third transfer-connection electrode 130 can serve as the second node N2 in the circuit structure illustrated in FIG. 1B), so that the circuit connection and structural layout of the shift register unit 105 can be further optimized, and the size of the shift register unit 105 can be reduced, thereby facilitating the narrow frame design of the display substrate.

For example, as illustrated in FIG. 2 and FIG. 4, the display substrate further includes a third connection wire L3, the third connection wire L3 is connected to and integrally formed with the first electrode CE12 of the second capacitor C2 and the gate electrode G6 of the third control transistor T6, and the first terminal L31 of the third connection wire L3 is connected to the first electrode CE12 of the second capacitor C2.

For example, as illustrated in FIG. 2, FIG. 4 and FIG. 7, the display substrate further includes a third transfer-connection electrode 130. The third transfer-connection electrode 130 includes a first portion 131 extending along the first direction Y and a second portion 132 which is integrally formed with the first portion 131 and extends along the second direction X. The first portion 131 of the third transfer-connection electrode 130 is connected to the first electrode of the second control transistor T3, and the second portion 132 of the third transfer-connection electrode 130 is connected to the first electrode of the first control transistor T2. The second terminal L32 of the third connection wire L3 is connected to the third transfer-connection electrode 130 through a via hole penetrating through the second insulating layer 360 and the third insulating layer 370, so that the gate electrode G6 of the third control transistor T6 can be connected with the first electrode of the first control transistor T2 and the first electrode of the second control transistor T3 located in a different layer (e.g., the third conductive layer 340).

For example, the third transfer-connection electrode 130 may serve as the second node N2 in the circuit structure illustrated in FIG. 1B. Therefore, in the case where the first connection wire L1 is provided to extend from the lower left side of the first control transistor T2 to the upper right side of the first control transistor T2, the transfer-connection hole corresponding to the second node N2 can no longer be arranged side by side with the second portion L12 of the first connection wire L1 along the second direction X, thereby further reducing the size of the shift register unit 105 in the second direction X and facilitating the narrow frame design of the display substrate. In addition, as illustrated in FIG. 2, the transfer-connection hole corresponding to the second node N2 can be compactly arranged in the gap between the first connection wire L1 and the third control transistor T6 in the second direction X, thereby further optimizing the circuit connection and structural layout of the shift register unit 105, reducing or avoiding the waste of space on the display substrate, and further reducing the size of the shift register unit 105 in the second direction X, so as to facilitate the narrow frame design of the display substrate.

For example, as illustrated in FIG. 2 and FIG. 3, the orthographic projection of the active layer A8 of the first noise reduction transistor T8 on the base substrate 10 is located on a side of the orthographic projection of the first capacitor C1 on the base substrate 10 close to the display region 102, and located on a side of the orthographic projection of the active layer A6 of the third control transistor T6 on the base substrate 10 away from the orthographic projection of the second capacitor C2 on the base substrate 10. For example, in the second direction X, the first noise reduction transistor T8 is located on the right side of the first capacitor C1; and in the first direction Y, the first noise reduction transistor T8 is located below the third control transistor T6.

For example, as illustrated in FIG. 2 and FIG. 4, the orthographic projection of the first electrode CE11 of the first capacitor C1 on the base substrate 10 has a stepped shape in the first direction Y, and has a protrusion protruding along the second direction X as the gate electrode G8 of the first noise reduction transistor T8. Thus, by enabling the first electrode CE11 of the first capacitor C1 to have a stepped shape in the first direction Y, the size occupied by the first electrode CE11 of the first capacitor C1 in the second direction X can be reduced, thereby optimizing the circuit connection and structural layout of the shift register unit 105, and further reducing the size occupied by the shift register unit 105 in the second direction X to a certain extent.

For example, as illustrated in FIG. 2 and FIG. 3, the orthographic projection of the active layer A7 of the fourth control transistor T7 on the base substrate 10 is located between the orthographic projection of the active layer A6 of the third control transistor T6 on the base substrate 10 and the orthographic projection of the active layer A8 of the first noise reduction transistor T8 on the base substrate 10.

For example, as illustrated in FIG. 2, FIG. 3 and FIG. 4, the active layer A6 of the third control transistor T6, the active layer A7 of the fourth control transistor T7, and the active layer A8 of the first noise reduction transistor T8 are located in a continuous first semiconductor layer A13. In other words, the active layer A6 of the third control transistor T6, the active layer A7 of the fourth control transistor T7, and the active layer A8 of the first noise reduction transistor T8 are integrally formed. The active layer A7 of the fourth control transistor T7 and the active layer A8 of the first noise reduction transistor T8 extend along the first direction Y, and the gate electrode G7 of the fourth control transistor T7 and the gate electrode G8 of the first noise reduction transistor T8 extend along the second direction X and are arranged side by side in the first direction X. Thus, the first electrode, the gate electrode and the second electrode of the third control transistor T6, the first electrode, the gate electrode and the second electrode of the fourth control transistor T7, and the first electrode, the gate electrode and the second electrode of the first noise reduction transistor T8 can be alternately arranged along the first direction Y, so that the layout arrangement of the third control transistor T6, the fourth control transistor T7, and the first noise reduction transistor T8 can be implemented in a relatively simple way. Therefore, the total space occupied by the third control transistor T6, the fourth control transistor T7, and the first noise reduction transistor T8 in the display substrate can be relatively compressed. For example, the total space occupied by the third control transistor T6, the fourth control transistor T7, and the first noise reduction transistor T8 in the display substrate can be minimized, so that the size occupied by the shift register unit 105 in the second direction X can be further compressed to a certain extent, thereby facilitating the narrow frame design of the display substrate.

For example, as illustrated in FIG. 2, FIG. 5 and FIG. 7, the display substrate further includes a fourth transfer-connection electrode 140 and a first connection electrode M1. The fourth transfer-connection electrode 140 is connected to the first electrode of the third control transistor T6, the gate electrode G7 of the fourth control transistor T7 is connected to the fourth transfer-connection electrode 140 through a via hole penetrating through the second insulating layer 360 and the third insulating layer 370, and the second electrode CE21 of the first capacitor C1 is connected to the fourth transfer-connection electrode 140 through a via hole penetrating through the third insulating layer 370. The first connection electrode M1 is located in the same layer as the second electrode CE21 of the first capacitor C1, the first terminal M11 of the first connection electrode M1 is connected to the first clock signal line CLK to receive the second clock signal through a via hole penetrating through the third insulating layer 370, and the second terminal M12 of the first connection electrode M1 is connected to the fourth transfer-connection electrode 140 through a via hole penetrating through the third insulating layer 370.

It should be noted that in other embodiments of the present disclosure, the first terminal M11 of the first connection electrode M1 may also be connected to the second clock signal line CLB through a via hole penetrating through the third insulating layer 370 to receive the second clock signal, and the embodiments of the present disclosure are not limited in this aspect.

For example, as illustrated in FIG. 2, FIG. 5 and FIG. 7, the display substrate further includes a fifth transfer-connection electrode 150. The fifth transfer-connection electrode 150 is connected to the second electrode of the third control transistor T6 and the first electrode of the fourth control transistor T7, and the second electrode CE22 of the second capacitor C2 is connected to the fifth transfer-connection electrode 150 through a via hole penetrating through the third insulating layer 370.

For example, the fifth transfer-connection electrode 150 may serve as the fourth node N4 in the circuit structure illustrated in FIG. 1B.

For example, as illustrated in FIG. 2 and FIG. 3, the orthographic projection of the third capacitor C3 on the base substrate 10 and the orthographic projection of the second capacitor C2 on the base substrate 10 are arranged side by side in the first direction Y, and the orthographic projection of the third capacitor C3 on the base substrate 10 and the orthographic projection of the first capacitor C1 on the base substrate 10 are arranged side by side in the second direction X. The orthographic projection of the active layer A9 of the output transistor T9 on the base substrate 10 is located on a side of the orthographic projection of the second capacitor C2 on the base substrate 10 close to the display region 102, and the orthographic projection of the active layer of the output reset transistor T10 on the base substrate 10 is located on a side of the orthographic projection of the third capacitor C3 on the base substrate 10 close to the display region 102. Thus, by allowing the second capacitor C2 and the third capacitor C3 to be arranged side by side in the first direction Y, for example, the second capacitor C2 being located above the third capacitor C3, the number of components arranged side by side in the second direction X can be further reduced, so that the space occupied by the second capacitor C2 and the third capacitor C3 in the second direction X can be reduced, and the size occupied by the shift register unit 105 in the second direction X can be further reduced to a certain extent, thereby facilitating the narrow frame design of the display substrate and ensuring the display quality of the display substrate at the same time.

For example, as illustrated in FIG. 2 and FIG. 4, a contour of a side of the orthographic projection of the first electrode CE13 of the third capacitor C3 on the base substrate 10 towards the orthographic projection of the second capacitor C2 on the base substrate 10 is stepped. Therefore, while the circuit connection and structural layout of the shift register unit 105 can be optimized, enough space can be reserved for the third capacitor C3, thereby improving the stability of the third capacitor C3.

For example, as illustrated in FIG. 2, FIG. 3 and FIG. 4, the active layer A9 of the output transistor T9 and the active layer A10 of the output reset transistor T10 are located in a continuous second semiconductor layer A12, that is, the active layer A9 of the output transistor T9 and the active layer A10 of the output reset transistor T10 are integrally formed. The second semiconductor layer A12 extends along the first direction Y. The orthographic projection of the active layer A9 of the output transistor T9 on the base substrate 10 and the orthographic projection of the second capacitor C2 on the base substrate 10 are arranged in parallel in the second direction X, and the orthographic projection of the active layer A10 of the output reset transistor T10 on the base substrate 10 and the orthographic projection of the third capacitor C3 on the base substrate 10 are arranged in parallel in the second direction X. The gate electrode G9 of the output transistor T9 and the gate electrode G10 of the output reset transistor T10 extend along the first direction Y, and the gate electrode G9 of the output transistor T9 includes a plurality of sub-gate electrodes arranged in parallel in the first direction Y. For example, the gate electrode G9 of the output transistor T9 is comb-shaped in the first direction Y to improve the stability of the output transistor T9.

For example, the gate electrode of the output transistor T9 and the gate electrode of the output reset transistor T10 are arranged side by side in the first direction Y. For example, the gate electrode of the output transistor T9 and the gate electrode of the output reset transistor T10 may be parallel to each other, and for example, may both extend along the second direction X. Alternatively, the extending direction of the gate electrode of the output transistor T9 and the extending direction of the gate electrode of the output reset transistor T10 may not be parallel to each other, and for example, may intersect at a certain angle. For example, the intersecting angle may be smaller than or equal to 20 degrees, or the range of the angle between the extending direction and the horizontal line may be smaller than or equal to 20 degrees, and the embodiments of the present disclosure are not limited in this aspect, as long as the gate electrode of the output transistor T9 and the gate electrode of the output reset transistor T10 are integrally provided and arranged up and down along the first direction Y.

For example, the orthographic projection of the gate electrode G10 of the output reset transistor T10 on the base substrate 10 is closer to the display region 102 than the orthographic projection of the gate electrode G9 of the output transistor T9 on the base substrate 10. For example, the center of the orthographic projection of the gate electrode G10 of the output reset transistor T10 on the base substrate 10 is closer to the display region 102 than the center of the orthographic projection of the gate electrode G9 of the output transistor T9 on the base substrate 10. The size of the orthographic projection of the active layer A10 of the output reset transistor T10 on the base substrate 10 in the second direction X is smaller than the size of the orthographic projection of the active layer A9 of the output transistor T9 on the base substrate 10 in the second direction X. Therefore, in the case where the second capacitor C2 and the third capacitor C3 are arranged side by side in the first direction Y, the structural layout of the shift register unit 105 in the second direction X can be further optimized by adjusting the positions of the gate electrode G10 of the output reset transistor T10 and the gate electrode G9 of the output transistor T9, thereby further reducing the size of the shift register unit 105 in the second direction X.

For example, as illustrated in FIG. 2, FIG. 4, and FIG. 7, the display substrate further includes a fourth connection wire L4, a sixth transfer-connection electrode 160, and a second power line VGH for providing the second voltage. The orthographic projection of the second power line VGH on the base substrate 10 is located on a side of the orthographic projection of the second capacitor C2 on the base substrate 10 close to the display region 102. The orthographic projection of the third capacitor C3 on the base substrate 10 partially overlaps with the orthographic projection of the second power line VGH on the base substrate 10. The second electrode CE23 of the third capacitor C3 is connected to the second power line VGH through a via hole penetrating through the third insulating layer 370. The fourth connection wire L4 is connected to and integrally formed with the first electrode CE13 of the third capacitor C3 and the gate electrode G9 of the output transistor T9. The sixth transfer-connection electrode 160 includes a first portion 161 extending along the first direction Y and a second portion 162 which is integrally formed with the first portion 161 and extends along the second direction X. The second portion 162 of the sixth transfer-connection electrode 160 is connected to the second electrode of the fourth control transistor T7 and the first electrode of the first noise reduction transistor T8. The first electrode CE13 of the third capacitor C3 is connected to the first portion 161 of the sixth transfer-connection electrode 160 through a via hole penetrating through the second insulating layer 360 and the third insulating layer 370.

For example, the sixth transfer-connection electrode 160 may serve as the third node N3 in the circuit structure illustrated in FIG. 1B.

For example, as illustrated in FIG. 2 and FIG. 7, the second power line VGH includes a protrusion P1 protruding away from the display region 102 in the second direction X, and the second electrode of the first noise reduction transistor T8 is connected to the protrusion P1 of the second power line VGH.

For example, as illustrated in FIG. 2, FIG. 3, and FIG. 7, the second power line VGH further includes a protrusion P2 protruding towards the display region 102 in the second direction X, and the first electrode of the output transistor T9 is connected to and integrally formed with the protrusion P2 of the second power line VGH.

For example, as illustrated in FIG. 2, FIG. 4, FIG. 5 and FIG. 7, the display substrate further includes a seventh transfer-connection electrode 170, an eighth transfer-connection electrode 180, and a second connection electrode M2. The seventh transfer-connection electrode 170 is connected to the second electrode of the output transistor T9, and the eighth transfer-connection electrode 180 is connected to the second electrode of the output reset transistor T10. The second connection electrode M2 is located in the same layer as the second electrode CE21 of the first capacitor C1, and the seventh transfer-connection electrode 170 and the eighth transfer-connection electrode 180 are respectively connected to the second connection electrode M2 through via holes penetrating through the third insulating layer 370, so that the second electrode of the output transistor T9 and the second electrode of the output reset transistor T10 are both connected to the second connection electrode M2 (i.e., the output terminal EOUT), thereby implementing the output of the output signal and the reset of the output terminal EOUT. The second connection electrode M2 is connected to the gate line as the output terminal EOUT, so as to output the output signal of the output terminal EOUT to the pixel unit 103 of the display region 102.

For example, the second connection electrode M2 may have two output terminals EOUT for providing output signals to the pixel units 103 in two adjacent rows of the display region 102. For example, the two output terminals EOUT are arranged side by side in the first direction Y. The second connection electrode M2 may also have still another output terminal EOUT (e.g., the output terminal CR illustrated in FIG. 2 and FIG. 5) that provides the output signal to the next shift register unit as the input signal of the next shift register unit. For example, the output terminal EOUT may be connected to the input terminal EI of the next shift register unit.

For example, as illustrated in FIG. 2, FIG. 5 and FIG. 7, the display substrate further includes a ninth transfer-connection electrode 190, the first terminal 191 of the ninth transfer-connection electrode 190 is connected to the second electrode of the input transistor T1, and the second terminal 192 of the ninth transfer-connection electrode 190 is connected to the input terminal EI through a via hole penetrating through the third insulating layer 370, so as to be connected to the second connection electrode M2 of the previous shift register unit to receive the output signal of the output terminal of the previous shift register unit as the input signal of the input terminal of the current shift register unit.

For example, as illustrated in FIG. 2 and FIG. 3, the active layer A1 of the input transistor T1, the active layer A4 of the second noise reduction transistor T4, and the active layer A5 of the third noise reduction transistor T5 are located in a continuous third semiconductor layer A11. In other words, the active layer A1 of the input transistor T1, the active layer A4 of the second noise reduction transistor T4, and the active layer A5 of the third noise reduction transistor T5 are integrally formed, so that the first electrode of the input transistor T1 is connected to the first electrode of the second noise reduction transistor T4, and the second electrode of the second noise reduction transistor T4 is connected to the second electrode of the third noise reduction transistor T5. The orthographic projection of the active layer A4 of the second noise reduction transistor T4 on the base substrate 10 and the active layer A5 of the third noise reduction transistor T5 on the base substrate 10 are located on a side of the orthographic projection of the active layer A2 of the first control transistor T2 on the base substrate 10 away from the orthographic projection of the first capacitor C1 on the base substrate 10, and located on a side of the orthographic projection of the active layer A1 of the input transistor T1 on the base substrate 10 close to the display region 102. The orthographic projection of the active layer A5 of the third noise reduction transistor T5 on the base substrate 10 is located on a side of the orthographic projection of the active layer A4 of the second noise reduction transistor T4 on the base substrate 10 away from the orthographic projection of the active layer A1 of the input transistor T1 on the base substrate 10.

For example, as illustrated in FIG. 2, FIG. 3 and FIG. 4, the orthographic projection of the second power line VGH for providing the second voltage on the base substrate 10 partially overlaps with the orthographic projection of the active layer A5 of the third noise reduction transistor T5 on the base substrate 10, the gate electrode G5 of the third noise reduction transistor T5 is connected to and integrally formed with the first electrode CE12 of the second capacitor C2, and the gate electrode G4 of the second noise reduction transistor T4 is connected to the fourth transfer-connection electrode 140 through a via hole penetrating through the second insulating layer 360 and the third insulating layer 370.

For example, the orthographic projection of the first clock signal line CLK and the second clock signal line CLB on the base substrate 10 is located on a side of the orthographic projection of the first power line VGL1 on the base substrate 10 away from the display region 102.

For example, as illustrated in FIG. 2 and FIG. 7, the orthographic projection of the third power line VGL2 on the base substrate 10 is located between the orthographic projection of the shift register unit 105 on the base substrate 10 and the display region 102, the third power line VGL2 includes a protrusion P3 protruding away from the display region 102 in the second direction X different from the first direction Y, and the first electrode of the output reset transistor T10 is connected to the protrusion P3 of the third power line VGL2.

For example, the display substrate further includes a gate driving circuit (not shown in the figure) and a trigger signal line ESTV. For example, the trigger signal line ESTV is configured to provide a trigger signal to the gate driving circuit, and the orthographic projection of the trigger signal line ESTV on the base substrate 10 is located on a side of the orthographic projection of the first clock signal line ECK and the second clock signal line ECB on the base substrate 10 away from the display region 102. For example, the gate driving circuit is the aforementioned light-emitting control driving circuit array (the EM GOA), which includes a plurality of cascaded shift register units 105, so that light-emitting control signals can be output row by row.

For example, the trigger signal line ESTV is connected to the second electrode of the input transistor T1 of the first shift register unit in the gate driving circuit to provide the trigger signal. Detailed description may be referred to the previous description, and details are not described herein again.

For example, in some embodiments of the present disclosure, the line width of the wire in each layer is generally 3 microns, and for example, the distance between wires in the same layer is greater than 3 microns. For example, the distance between wires is related to the accuracy of the exposure machine. The higher the accuracy of the exposure machine, the smaller the distance between wires can be, which may be determined according to the actual situation. The embodiments of the present disclosure are not limited in this aspect. In the embodiments of the present disclosure, necessary intervals must be reserved between the wires in the same layer to avoid wire adhesion, signal short circuit, or the like in the actual process.

The distance between orthographic projections of respective wires in the first conductive layer 320 on the base substrate 10 is generally 1.5 microns, and the distance between orthographic projections of respective wires in the second conductive layer 330 on the base substrate 10 is generally 1.5 microns. For example, the gate electrode of the transistor in the first conductive layer 320 exceeds the active layer in the semiconductor layer 310 by more than 2 microns. For example, as illustrated in FIG. 2, FIG. 3 and FIG. 4, the U-shaped double gate electrodes (the first gate electrode G21 and the second gate electrode G22) of the first control transistor T2 exceed the active layer of the first control transistor T2 on both sides of the active layer by such as more than 2 microns in the first direction Y. For example, the length of the part, which does not overlap with the active layer of the first control transistor T2, in the first direction Y is more than 2 microns, and the embodiments of the present disclosure are not limited in this aspect.

For example, the distance between orthographic projections of active layers of respective transistors in the semiconductor layer 310 on the base substrate 10 is more than 1.5 microns, and the distance between orthographic projections of respective gate wires in the first conductive layer 320 on the base substrate 10 is more than 1.5 microns, so that the channel effect between the gate wire and the active layer of each transistor in the semiconductor layer 310 can be avoided. For example, the distance between the orthographic projection of the semiconductor layer 310 on the base substrate 10 and the orthographic projection of the second conductive layer 330 on the base substrate 10 may be unlimited, and for example, may be overlapped. For example, in some embodiments of the present disclosure, a certain distance is reserved as far as possible between wires in different layers (the distance is smaller than the distance between wires in the same layer), so that unnecessary overlap can be reduced to reduce or avoid interference caused by excessive parasitic capacitance.

For example, the width of each wire in the third conductive layer 340 is set to cover (for example, completely cover) the corresponding via hole. For example, the width of the wire may be larger than the size (for example, the diameter of the via hole) of the corresponding via hole, and the difference between the width of the wire and the size of the corresponding via hole may be equal to or greater than 1 micron. For example, the size of the via hole ranges from 2.0 microns to 2.5 microns, and the width of the wire, covering the corresponding via hole, in the third conductive layer 340 ranges from 4 microns to 5 microns. For example, the line widths of wires, corresponding to via holes, of the output reset transistor T10 and the output transistor T9 exceed the corresponding via holes by more than 1 micron. For example, the line widths of wires of the output reset transistor T10 and the output transistor T9 range from 4.0 microns to 4.5 microns. Because the number of via holes corresponding to the output reset transistor T10 and the output transistor T9 is large, the line widths of the wires, for connecting other transistors, in the third conductive layer 340 only need to be set to cover the corresponding via holes and exceed the corresponding via holes by more than 1 micron. For example, the width of the wire between via holes may be smaller.

For example, the distance between wires, such as the first clock signal line ECK, the second clock signal line ECB, the second power line VGH, the first power line VGL1, the third power line VGL2, or the like in the third conductive layer 340 may be equal to or greater than 3 microns. The line widths of the first clock signal line ECK and the second clock signal line ECB are required to be equal to or larger than 9 microns, to satisfy the driving capability of the first clock signal line ECK and the second clock signal line ECB. For example, the line widths of the first power line VGL1 and the third power line VGL2 may be 6 microns, 9 microns, 10 microns, or the like. For example, the line width of the second power line VGH may be 10 microns. For example, the first voltage provided by the first power line VGL1 and the third power line VGL2 is generally −7V.

For example, in some examples, the thickness of the first conductive layer 320 and the thickness of the second conductive layer 330 range from 2000 angstroms to 3000 angstroms, the thickness of the third conductive layer 340 ranges from 5000 angstroms to 8000 angstroms, and the embodiments of the present disclosure are not limited in this aspect.

For example, by providing the above-mentioned transfer-connection electrodes, connection electrodes and connection wires, problems, which are caused by densely arranged wires in the same layer, such as the wire adhesion, signal short circuit, or the like can be reduced or avoided. For example, the above-mentioned transfer-connection electrodes, connection electrodes and connection wires are provided for realizing connection or jumper connection.

The display substrate provided by the above-mentioned embodiments of the present disclosure optimizes the circuit connection and structural layout of the shift register unit, and reduces the length of the shift register unit in the first direction or the second direction to a certain extent, thereby reducing the size of the shift register unit, facilitating the narrow frame design with the display substrate, and ensuring the display quality of the display substrate at the same time.

Figure 9:
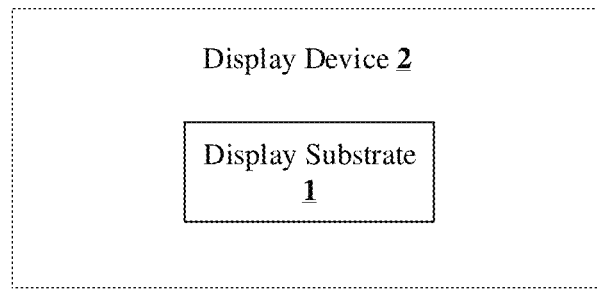
FIG. 9 is a schematic diagram of a display device provided by at least one embodiment of the present disclosure.

At least one embodiment of the present disclosure further provides a display device. FIG. 9 is a schematic diagram of a display device provided by at least one embodiment of the present disclosure. As illustrated in FIG. 9, the display device 2 includes a display substrate 1, and the display substrate 1 may be the display substrate provided by any one of the embodiments of the present disclosure, and for example, may be the display substrate as illustrated in FIG. 2.

It should be noted that the display device 2 may be any product or component with a display function, such as an OLED panel, an OLED TV, a QLED panel, a QLED TV, a mobile phone, a tablet computer, a notebook computer, a digital photo frame, a navigator, or the like. The display device 2 may further include other components, such as a data driving circuit, a timing controller, etc., and the embodiments of the present disclosure are not limited in this aspect.

It should be noted that, for the sake of clarity and simplicity, the embodiments of the present disclosure do not illustrate all the components of the display device 2. In order to realize the basic functions of the display device 2, those skilled in the art can provide and set other structures, which are not shown, according to specific needs, and the embodiments of the present disclosure are not limited in this aspect.

The technical effects of the display device 2 provided by the above embodiments may be referred to the technical effects of the display substrate (for example, the display substrate as illustrated in FIG. 2) provided in the embodiments of the present disclosure, and details are not described herein again.

Figure 10:
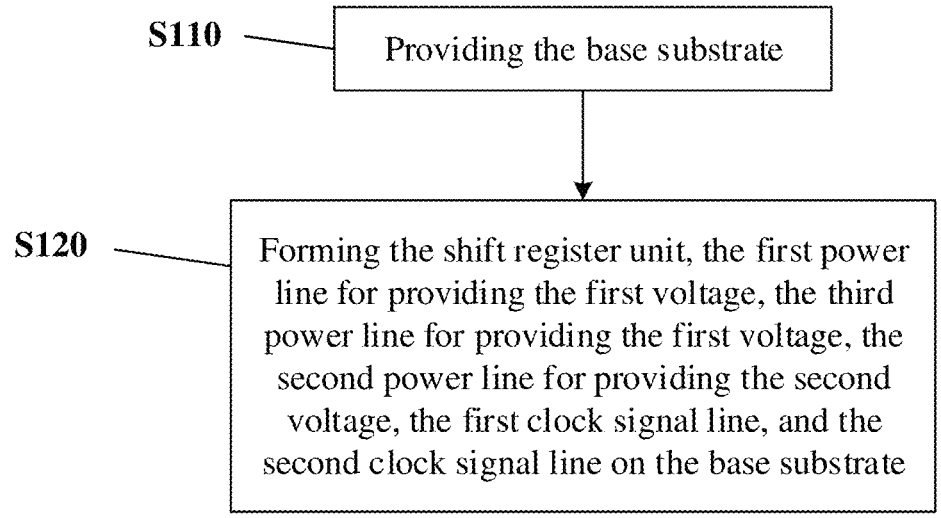
FIG. 10 is a flowchart of a manufacturing method of a display substrate provided by at least one embodiment of the present disclosure.

At least one embodiment of the present disclosure further provides a manufacturing method of a display substrate, for example, a manufacturing method of the display substrate provided by any one of the embodiments of the present disclosure. FIG. 10 is a flowchart of a manufacturing method of a display substrate provided by at least one embodiment of the present disclosure. For example, the manufacturing method may be used for manufacturing the display substrate provided by any one of the embodiments of the present disclosure. For example, the manufacturing method may be used for manufacturing the display substrate as illustrated in FIG. 2.

As illustrated in FIG. 10, the manufacturing method of the display substrate includes the following steps S110 to S120.

Step S110: providing the base substrate.

Step S120: forming the shift register unit, the first power line for providing the first voltage, the third power line for providing the first voltage, the second power line for providing the second voltage, the first clock signal line, and the second clock signal line on the base substrate.

For example, forming the semiconductor layer, the first insulating layer, the first conductive layer, the second insulating layer, the second conductive layer, the third insulating layer, and the third conductive layer includes: forming a corresponding material layer (for example, a semiconductor material layer, an insulating material layer, or a conductive material layer), and forming a corresponding pattern structure (for example, an active layer, an electrode pattern, a wire, a via hole, etc.) by using a patterning process. For example, the patterning process is a photolithography process and includes: coating a photoresist layer on the material layer to be patterned, performing an exposing process on the photoresist layer with a mask, performing a developing process on the photoresist layer after the exposing process to obtain a photoresist pattern, etching a structure layer with the photoresist pattern, and optionally removing the photoresist pattern.

For Step S110, for example, the base substrate 10 may adopt glass, plastic, quartz, or other suitable materials, and the embodiments of the present disclosure are not limited in this aspect.

For example, the shift register unit 105, the first power line VGL1, the second power line VGH, the third power line VGL2, the first clock signal line ECK, and the second clock signal line ECB are formed on the base substrate 10.

For Step S120, for example, forming the shift register unit 105 includes: forming the semiconductor layer 310, the first insulating layer 350, the first conductive layer 320, the second insulating layer 360, the second conductive layer 330, the third insulating layer 370, and the third conductive layer 340 in sequence in the direction perpendicular to the base substrate 10. Active layers of respective transistors are in the semiconductor layer 310, gate electrodes of the respective transistors and first electrodes of respective capacitors are in the first conductive layer 320, second electrodes of the respective capacitors are in the second conductive layer 330, and the first power line VGL1, the second power line VGH, the third power line VGL2, the first clock signal line ECK, the second clock signal line ECB, and first electrodes and second electrodes of the respective transistors are in the third conductive layer 340.

For example, the transistors and the capacitors are correspondingly connected to each other through via holes penetrating through the first insulating layer 350, the second insulating layer 360, or the third insulating layer 370, and the transistors and the capacitors are correspondingly connected to the first power line VGL1, the second power line VGH, the third power line VGL2, the first clock signal line ECK, and the second clock signal line ECB through via holes penetrating through the first insulating layer 350, the second insulating layer 360, or the third insulating layer 370.

The arrangements of connection structures for connecting the transistors and the capacitors of the shift register unit 105 with the second power line VGH, the first power line VGL1, the third power line VGL2, the clock signal lines, the connection wires, the connection electrodes, the transfer-connection electrodes, or the like may be referred to the descriptions related to FIG. 2 to FIG. 8, and details are not described herein again.

It should be noted that, in the embodiments of the present disclosure, the process of the manufacturing method of the display substrate may include more or fewer operations, and these operations may be performed sequentially or in parallel. Although the process of the manufacturing method described above includes a plurality of operations in a specific order, it should be clearly understood that the order of the operations is not limited. The manufacturing method described above may be executed once, or may be executed several times according to the predetermined setting.

The technical effects of the manufacturing method of the display substrate provided by the above-mentioned embodiments may be referred to the technical effects of the display substrate (for example the display substrate as illustrated in FIG. 2) provided by the embodiments of the present disclosure, and details are not described herein again.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above merely are specific implementations of the present disclosure, and the protection scope of the present disclosure is not limited thereto. The protection scope of the present disclosure should be based on the protection scope of the claims.

What is claimed is:

1. A display substrate, comprising:
a base substrate, comprising a display region and a peripheral region on at least one side of the display region; and
a shift register unit, a first clock signal line, and a second clock signal line, which are in the peripheral region of the base substrate, wherein the first clock signal line and the second clock signal line extend along a first direction on the base substrate, and are configured to provide a first clock signal or a second clock signal to the shift register unit, respectively;

the shift register unit comprises an input circuit, a first node control circuit, a second node control circuit, a third node control circuit, a fourth node control circuit, and an output circuit;

the input circuit is configured to input an input signal to a first node in response to the first clock signal;

the second node control circuit is configured to input a first voltage or the first clock signal to a second node under control of the first clock signal and a level of the first node, so as to control a level of the second node;

the first node control circuit is configured to input a second voltage to the first node under control of the second clock signal and the level of the second node, so as to perform noise reduction on the first node;

the third node control circuit is configured to control a level of a third node in response to the level of the second node;

the fourth node control circuit is configured to input the level of the third node to a fourth node under control of the second clock signal; and the output circuit is configured to output the second voltage to an output terminal under control of a level of the fourth node, wherein the second node control circuit comprises a first control transistor, and the first control transistor comprises a first gate electrode;

the display substrate further comprises a first connection wire, and the first connection wire comprises a first portion and a second portion;

the first portion of the first connection wire is connected to and integrally formed with the first gate electrode of the first control transistor, the first portion of the first connection wire extends along the first direction, and an orthographic projection of the first portion of the first connection wire on the base substrate is on a side of an orthographic projection of an active layer of the first control transistor on the base substrate away from the display region;

the second portion of the first connection wire is connected to and integrally formed with the first gate electrode of the first control transistor, the second portion of the first connection wire extends along a direction, opposite to an extending direction of the first portion of the first connection wire, in the first direction, and an orthographic projection of the second portion of the first connection wire on the base substrate is on a side of the orthographic projection of the active layer of the first control transistor on the base substrate close to the display region;

the first control transistor further comprises a second gate electrode, the first gate electrode and the second gate electrode of the first control transistor are in parallel in the first direction, the second gate electrode of the first control transistor is connected to and integrally formed with the first portion of the first connection wire, and the first gate electrode and the second gate electrode of the first control transistor are connected through the first portion of the first connection wire;

the second gate electrode of the first control transistor is connected to the second portion of the first connection wire through the first portion of the first connection wire and the first gate electrode of the first control transistor, so that the second gate electrode of the first control transistor is not directly connected to the second portion of the first connection wire; and an opening formed by the first portion of the first connection wire and the first gate electrode and the second gate electrode of the first control transistor is towards the display region.

2. The display substrate according to claim 1, further comprising an output reset circuit, wherein the output reset circuit is configured to reset the output terminal under control of the level of the first node;

the output reset circuit comprises a first capacitor and an output reset transistor;

a first electrode of the first capacitor is connected to and integrally formed with the first portion of the first connection wire, and an orthographic projection of the first electrode of the first capacitor on the base substrate is on an imaginary line, in the first direction, of the orthographic projection of the active layer of the first control transistor on the base substrate; and an orthographic projection of an active layer of the output reset transistor on the base substrate is on a side of an orthographic projection of the first capacitor on the base substrate close to the display region.

3. The display substrate according to claim 2, wherein the first connection wire further comprises a third portion, the third portion of the first connection wire is connected to and integrally formed with the first electrode of the first capacitor and a gate electrode of the output reset transistor, and the gate electrode of the output reset transistor comprises a plurality of sub-gate electrodes arranged in parallel in the first direction.

4. The display substrate according to claim 2, wherein the input circuit comprises an input transistor, an active layer of the input transistor extends along the first direction, the active layer of the first control transistor extends along the first direction, and an orthographic projection of the active layer of the input transistor on the base substrate is on a side of the orthographic projection of the active layer of the first control transistor on the base substrate away from the orthographic projection of the first capacitor on the base substrate and close to the display region.

5. The display substrate according to claim 4, further comprising a first transfer-connection electrode, wherein a first terminal of the first transfer-connection electrode is connected to the second portion of the first connection wire through a via hole penetrating through an insulating layer, and a second terminal of the first transfer-connection electrode is connected to a first electrode of the input transistor.

6. The display substrate according to claim 4, wherein the second node control circuit further comprises a second control transistor;

an active layer of the second control transistor comprises a first portion and a second portion which are integrally formed, the first portion of the active layer of the second control transistor extends along a direction different from the first direction, and the second portion of the active layer of the second control transistor extends along the first direction; and an orthographic projection of the active layer of the second control transistor on the base substrate is between the orthographic projection of the active layer of the input transistor on the base substrate and the orthographic projection of the active layer of the first control transistor on the base substrate.

7. The display substrate according to claim 6, further comprising a second connection wire in a substantially "Y" shape,
wherein the second connection wire is connected to and integrally formed with a gate electrode of the input transistor and a gate electrode of the second control transistor,
a first terminal of the second connection wire is connected to the gate electrode of the input transistor, a second terminal of the second connection wire is connected to the gate electrode of the second control transistor, and a third terminal of the second connection wire is connected to the first clock signal line or the second clock signal line through a via hole penetrating through an insulating layer to receive the first clock signal.

8. The display substrate according to claim 6, further comprising a second transfer-connection electrode,
wherein a first terminal of the second transfer-connection electrode is connected to a second electrode of the first control transistor, and a gate electrode of the second control transistor is connected to a second terminal of the second transfer-connection electrode through a via hole penetrating through an insulating layer.

9. The display substrate according to claim 6, further comprising a first power line for providing the first voltage,
wherein the first power line is connected to a second electrode of the second control transistor, and
an orthographic projection of the first power line on the base substrate is on a side of an orthographic projection of a gate electrode of the second control transistor on the base substrate away from the display region.

10. The display substrate according to claim 6, wherein the third node control circuit comprises a third control transistor and a second capacitor;
an orthographic projection of an active layer of the third control transistor on the base substrate and an orthographic projection of the second capacitor on the base substrate are on a side of the orthographic projection of the active layer of the first control transistor on the base substrate close to the display region, and the orthographic projection of the second capacitor on the base substrate is on a side of the orthographic projection of the active layer of the third control transistor on the base substrate away from the orthographic projection of the first capacitor on the base substrate; and
a gate electrode of the third control transistor extends along a second direction different from the first direction, and the active layer of the third control transistor extends along the first direction.

11. The display substrate according to claim 10, further comprising a third connection wire,
wherein the third connection wire is connected to and integrally formed with a first electrode of the second capacitor and the gate electrode of the third control transistor, and
a first terminal of the third connection wire is connected to the first electrode of the second capacitor.

12. The display substrate according to claim 10, further comprising a fourth node noise reduction circuit,
wherein the fourth node noise reduction circuit is configured to perform noise reduction on the fourth node under control of the level of the first node,
the fourth node noise reduction circuit comprises a first noise reduction transistor, and
an orthographic projection of an active layer of the first noise reduction transistor on the base substrate is on a side of the orthographic projection of the first capacitor on the base substrate close to the display region, and on a side of the orthographic projection of the active layer of the third control transistor away from the orthographic projection of the second capacitor on the base substrate.

13. The display substrate according to claim 12, wherein an orthographic projection of the first electrode of the first capacitor on the base substrate has a stepped shape in the first direction, and has a protrusion protruding along the second direction as a gate electrode of the first noise reduction transistor.

14. The display substrate according to claim 12, wherein the fourth node control circuit comprises a fourth control transistor, and
an orthographic projection of an active layer of the fourth control transistor on the base substrate is between the orthographic projection of the active layer of the third control transistor on the base substrate and the orthographic projection of the active layer of the first noise reduction transistor on the base substrate.

15. The display substrate according to claim 14, wherein the active layer of the third control transistor, the active layer of the fourth control transistor, and the active layer of the first noise reduction transistor are in a continuous first semiconductor layer,
the active layer of the fourth control transistor and the active layer of the first noise reduction transistor extend along the first direction, and
a gate electrode of the fourth control transistor and a gate electrode of the first noise reduction transistor extend along the second direction and are arranged in parallel in the first direction.

16. The display substrate according to claim 10, wherein the output circuit comprises a third capacitor and an output transistor;
an orthographic projection of the third capacitor on the base substrate and the orthographic projection of the second capacitor on the base substrate are arranged in parallel in the first direction, and the orthographic projection of the third capacitor on the base substrate and the orthographic projection of the first capacitor on the base substrate are arranged in parallel in the second direction; and
an orthographic projection of an active layer of the output transistor on the base substrate is on a side of the orthographic projection of the second capacitor on the base substrate close to the display region, and the orthographic projection of the active layer of the output reset transistor on the base substrate is on a side of the orthographic projection of the third capacitor on the base substrate close to the display region.

17. The display substrate according to claim 16, wherein a contour of a side of an orthographic projection of a first electrode of the third capacitor on the base substrate towards the orthographic projection of the second capacitor on the base substrate is stepped.

18. The display substrate according to claim 16, wherein the active layer of the output transistor and the active layer of the output reset transistor are in a continuous second semiconductor layer, and the second semiconductor layer extends along the first direction;
the orthographic projection of the active layer of the output transistor on the base substrate and the orthographic projection of the second capacitor on the base substrate are arranged in parallel in the second direction, and the orthographic projection of the active layer of the output reset transistor on the base substrate and the orthographic projection of the third capacitor on the base substrate are arranged in parallel in the second direction;

a gate electrode of the output transistor and a gate electrode of the output reset transistor extend along the first direction; and the gate electrode of the output transistor comprises a plurality of sub-gate electrodes arranged in parallel in the first direction.

19. The display substrate according to claim 16, wherein an orthographic projection of a gate electrode of the output reset transistor on the base substrate is closer to the display region than an orthographic projection of a gate electrode of the output transistor on the base substrate; and a size of the orthographic projection of the active layer of the output reset transistor on the base substrate in the second direction is smaller than a size of the orthographic projection of the active layer of the output transistor on the base substrate in the second direction.

* * * * *